United States Patent
Qin et al.

(10) Patent No.: US 9,530,842 B2
(45) Date of Patent: Dec. 27, 2016

(54) SEMICONDUCTOR DEVICES

(71) Applicant: Micron Technology, Inc., Boise, ID (US)

(72) Inventors: Shu Qin, Boise, ID (US); Yongjun Jeff Hu, Boise, ID (US); Allen McTeer, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/597,766

(22) Filed: Jan. 15, 2015

(65) Prior Publication Data

US 2016/0211324 A1 Jul. 21, 2016

(51) Int. Cl.
*H01L 29/76* (2006.01)
*H01L 29/08* (2006.01)
*H01L 29/45* (2006.01)
*H01L 21/223* (2006.01)
*H01L 27/092* (2006.01)

(52) U.S. Cl.
CPC ....... *H01L 29/0847* (2013.01); *H01L 21/2236* (2013.01); *H01L 27/092* (2013.01); *H01L 29/456* (2013.01)

(58) Field of Classification Search
None
See application file for complete search history.

(56) References Cited

U.S. PATENT DOCUMENTS

| | | | |
|---|---|---|---|
| 6,235,568 B1* | 5/2001 | Murthy | H01L 21/823814 257/E21.634 |
| 7,737,010 B2* | 6/2010 | Qin | H01L 21/2236 257/E21.256 |
| 7,911,007 B2* | 3/2011 | Takahashi | H01L 21/28052 257/384 |
| 2008/0026530 A1* | 1/2008 | Mono | H01L 21/26586 438/275 |
| 2010/0032794 A1* | 2/2010 | Pendharkar | H01L 21/761 257/509 |
| 2013/0334605 A1* | 12/2013 | Wu | H01L 21/2236 257/365 |

OTHER PUBLICATIONS

Wu et al., "ECV Profiling of Ultra-Shallow Junction Formed by Plasma Doping", Sixth International Workshop on Junction Technology, IEEE Catalog No. 06EX1256C, May 15-16, 2006.*

* cited by examiner

*Primary Examiner* — Johannes P Mondt
(74) *Attorney, Agent, or Firm* — Wells St. John P.S.

(57) ABSTRACT

Some embodiments include a device having an n-type diffusion region, and having a boron-doped region within the n-type diffusion region. The boron-doped region extends no deeper than about 10 nanometers from an upper surface of the n-type diffusion region. Some embodiments include a method in which first boron-enhanced regions are formed within upper portions of n-type source/drain regions of an NMOS (n-type metal-oxide-semiconductor) device and second boron-enhanced regions are simultaneously formed within upper portions of p-type source/drain regions of a PMOS (p-type metal-oxide-semiconductor) device. The first and second boron-enhanced regions extend to depths of less than or equal to about 10 nanometers.

8 Claims, 25 Drawing Sheets

Contact resistance Rcs of large area SD (W x L: 23.5 x 3) of NMOS device, (top) 1C control group, and (bottom) 2E experimental group.

Contact resistance Rcs of small area SD (W x L: 4.5 x 3) of NMOS device, (top) 1C control group, and (bottom) 2E experimental group.

Series resistance $R_{SD}$ of large area SD (W x L: 50x 2000) of NMOS device, (top) 1C control group, and (bottom) 2E experimental group.

Series resistance $R_{SD}$ of small area SD (W x L: 9x 2000) of NMOS device, (top) 1C control group, and (bottom) 2E experimental group.

Drive current $I_{DS}$ of standard (W x L: 80 x 1) NMOS device, (top) 1C control group, and (bottom) 2E experimental group.

Off current $I_{OFF}$ of standard (W x L: 80 x 1) NMOS device, (top) 1C control group, and (bottom) 2E experimental group.

Contact resistance Rcs of large area SD (W x L: 38.5 x 3) of PMOS device, (top) 1C control group, and (bottom) 2E experimental group.

Contact resistance Rcs of small area SD (W x L: 45 x 3) of PMOS device, (top) 1C control group, and (bottom) 2E experimental group.

Series resistance $R_{SD}$ of large area SD (W x L: 50 x 2000) of PMOS device, (top) 1C control group, and (bottom) 2E experimental group.

Series resistance $R_{SD}$ of small area SD (W x L: 9 x 2000) of PMOS device, (top) 1C control group, and (bottom) 2E experimental group.

Drive current $I_{DS}$ of standard (W x L: 80 x 1) PMOS device, (top) 1C control group, and (bottom) 2E experimental group.

Off current $I_{OFF}$ of standard (W × L: 80 × 1) PMOS device, (top) 1C control group, and (bottom) 2E experimental group.

Contact resistance $R_{CS}$ of SD regions of PMOS devices.

Series resistance $R_{SD}$ of SD regions of PMOS devices.

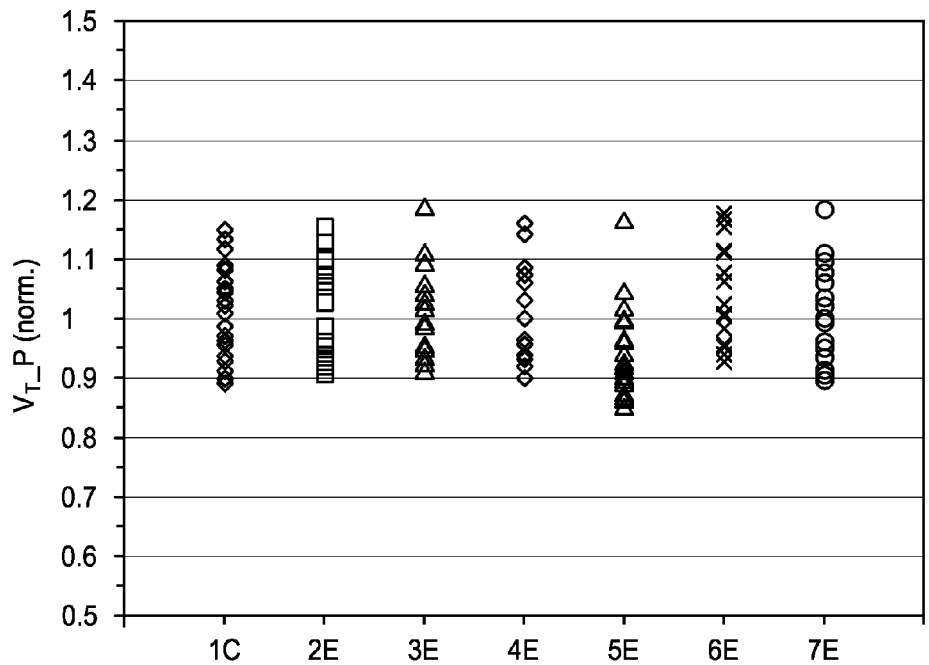
FIG. 23 Threshold voltage $V_T$ of the standard PMOS devices.
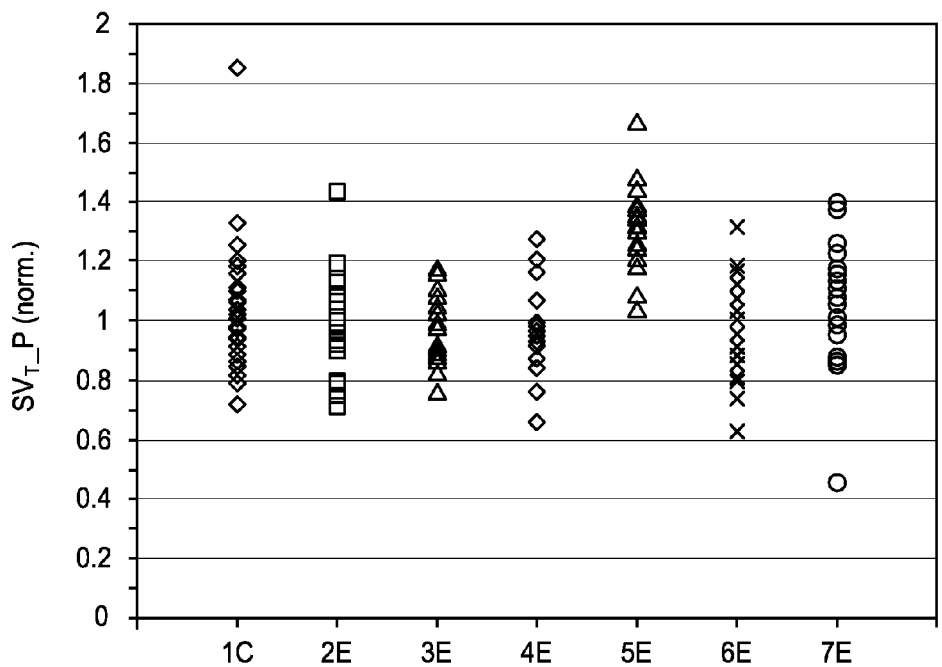
FIG. 24 Sub-threshold voltage $SV_T$ of the standard PMOS devices.

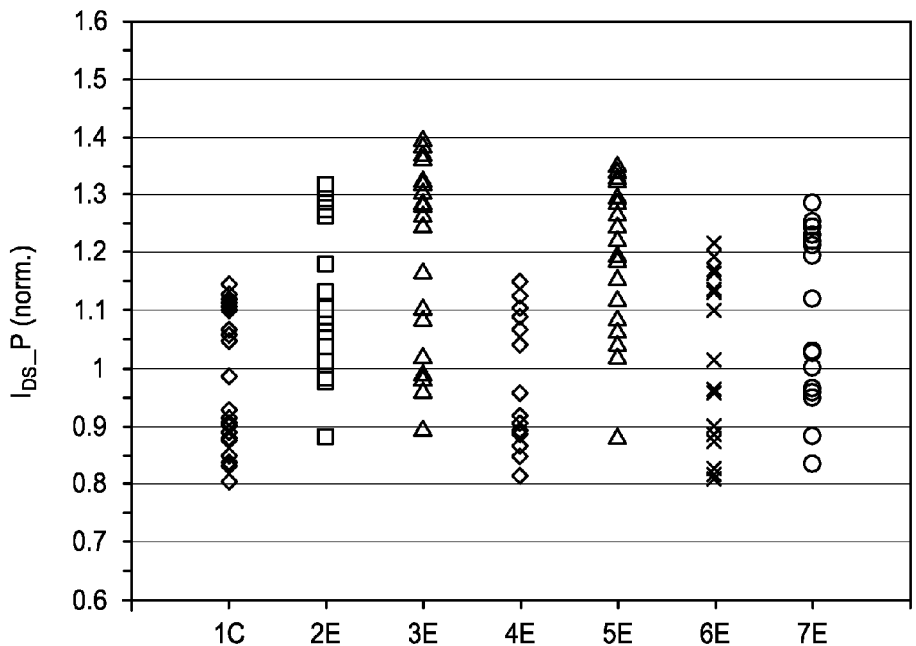
FIG. 25 $I_{DS}$ of the standard PMOS devices.
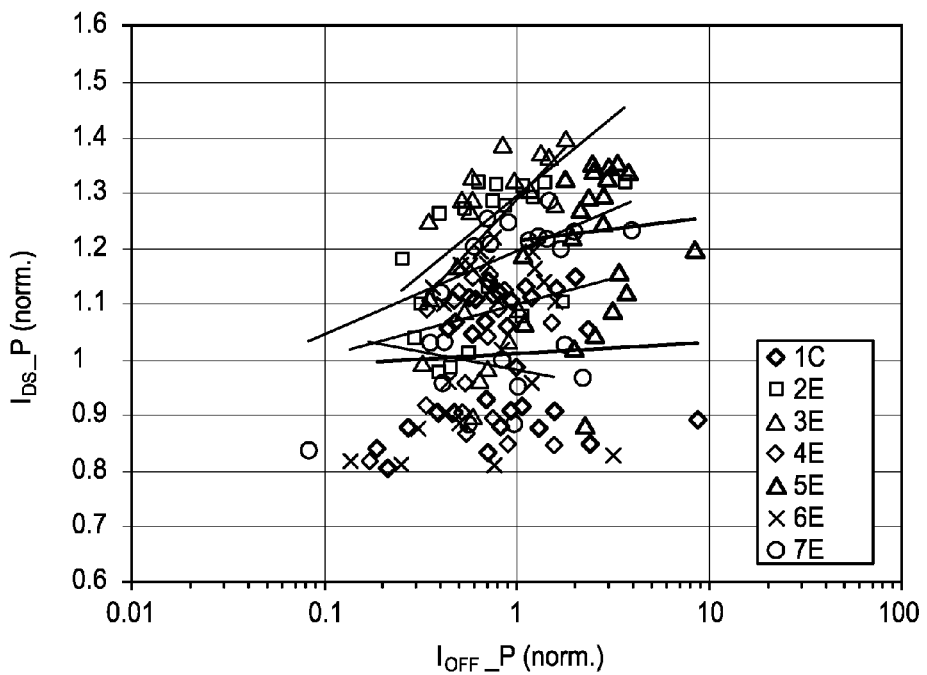
FIG. 26 $I_{DS}$ versus $I_{OFF}$ characteristics of the standard PMOS devices.

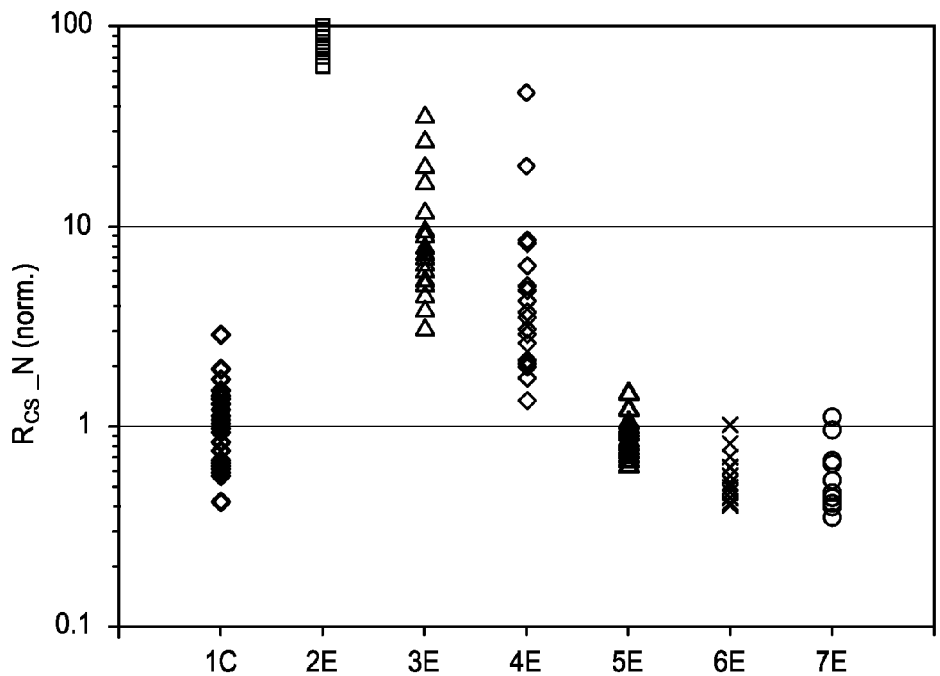
FIG. 27  Contact resistance $R_{CS}$ of SD regions of NMOS devices.
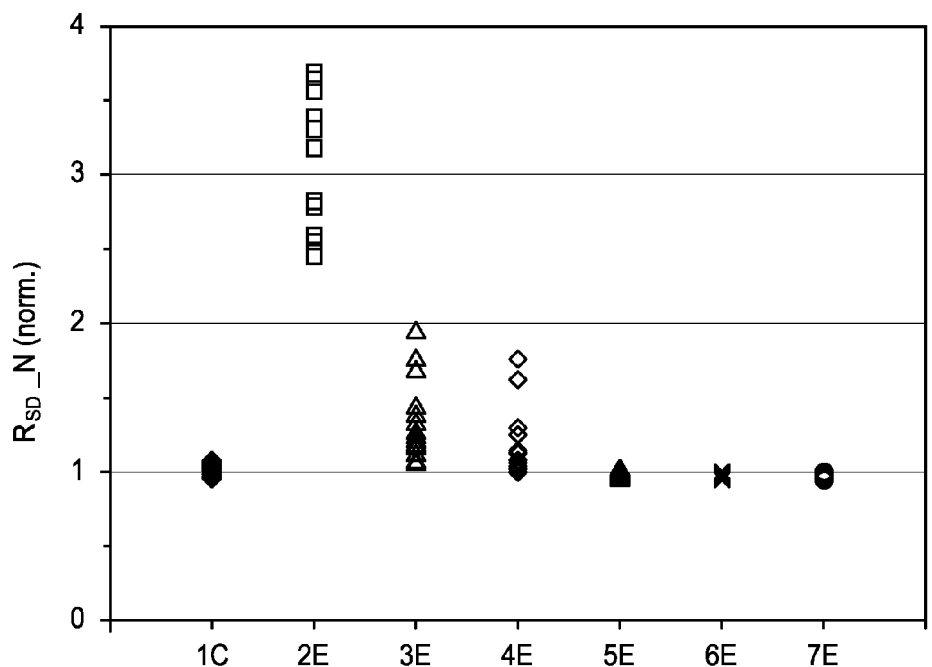
FIG. 28  Series resistance $R_{SD}$ of SD regions of NMOS devices.

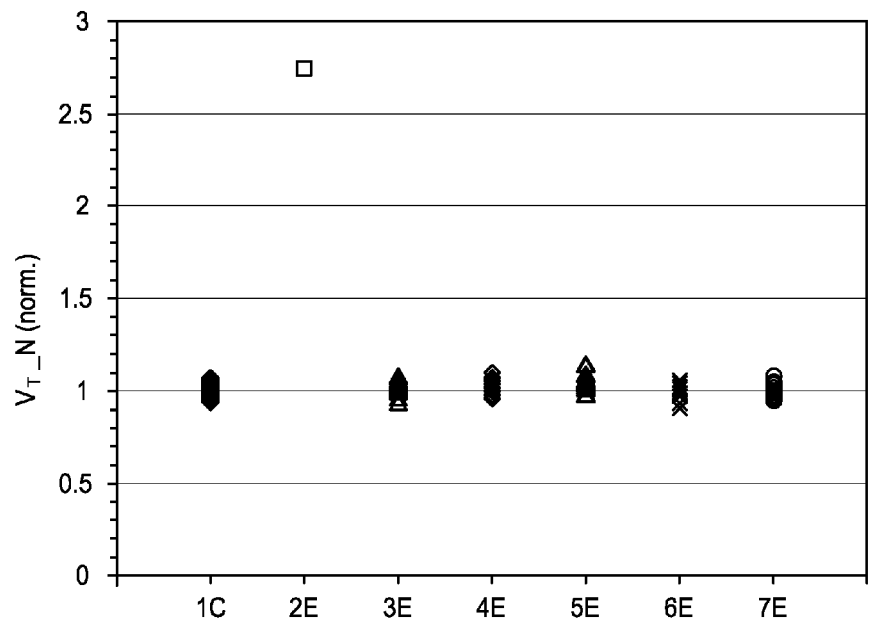
FIG. 29   Threshold voltage $V_T$ of the standard NMOS devices.
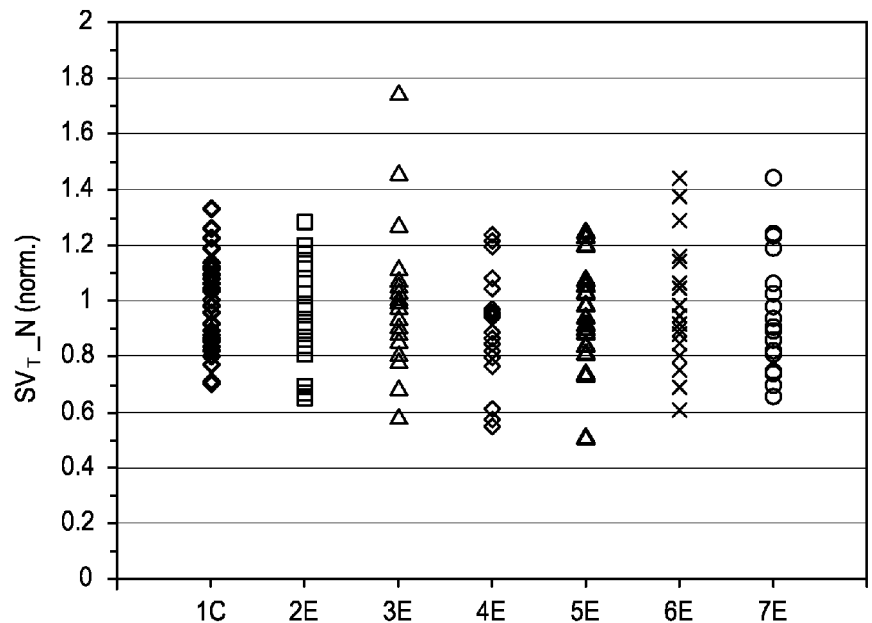
FIG. 30   Sub-threshold voltage $SV_T$ of the standard NMOS devices.

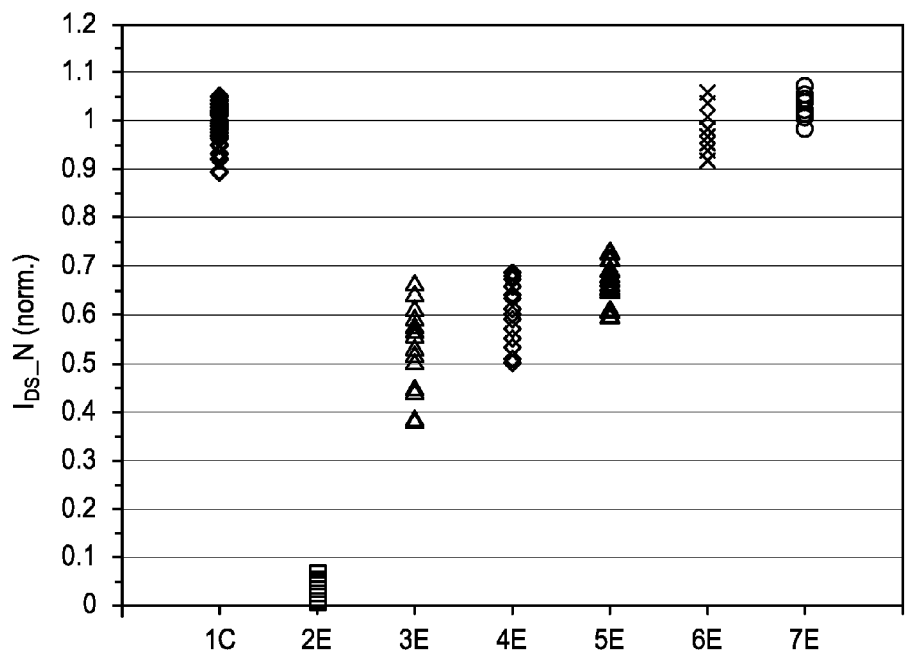
FIG. 31 $I_{DS}$ of the standard NMOS devices.
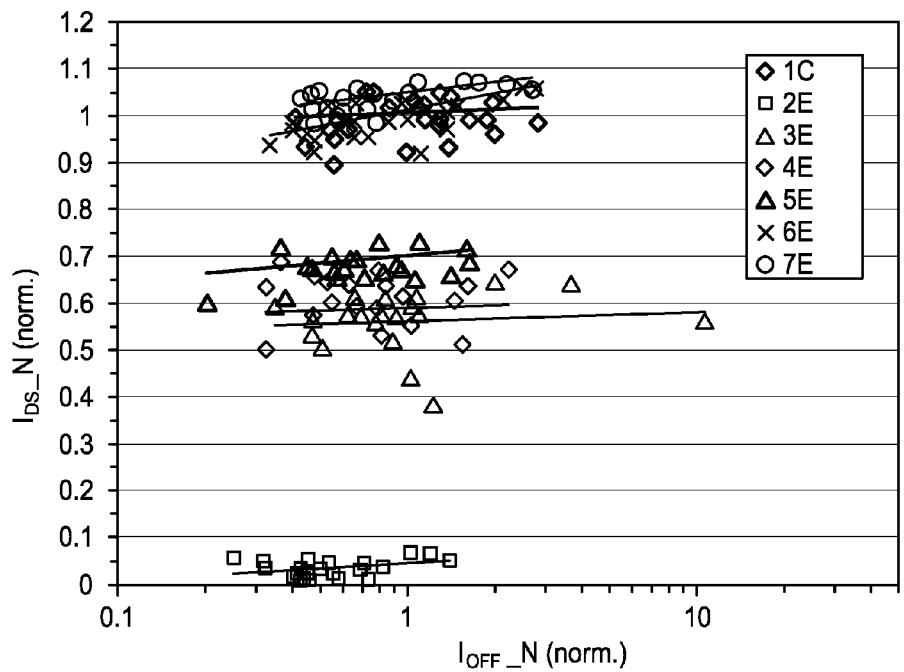
FIG. 32 $I_{DS}$ versus $I_{OFF}$ characteristics of the standard NMOS devices.

SEMICONDUCTOR DEVICES

TECHNICAL FIELD

Semiconductor devices, and methods of forming semiconductor devices. The devices may include, for example, transistors. The methods may include, for example, methods of forming transistors and methods of forming CMOS (complementary metal oxide semiconductor).

BACKGROUND

Integrated circuitry utilizes circuit devices. Example devices are transistors, and such may be used in numerous applications, including, for example, memory, logic, etc. Example transistors are PMOS (p-type metal oxide semiconductor) and NMOS (n-type metal oxide semiconductor). In some applications, a PMOS transistor may be utilized in combination with an NMOS transistor to form CMOS (complementary metal oxide semiconductor).

It is desired to develop transistors having suitable values of threshold voltage ($V_T$) and sub-threshold voltage ($SV_T$), high drive current ($I_{DS}$), and low enough device off current ($I_{OFF}$) for utilization in high-performance integrated circuitry. The sum of the contact resistance ($R_{CS}$) between source/drain regions and conductive interconnects, and series resistance in source/drain regions ($R_{SD}$), may limit $I_{DS}$. For instance, $R_{CS}$ may become more and more dominated to limit $I_{DS}$. $R_{CS}$ may be seriously degraded as devices are scaled down due to contact area decreasing as a function of square power on the scaling factor.

It is desired to develop new transistors which are suitable for utilization in high-performance integrated circuitry, and which are suitable for scaling into highly-integrated circuitry. It is also desired to develop new methods of forming transistors, and preferably to develop methods which reduce process steps as compared to conventional methods. It is further desirable for structures and methods to be extendible to devices other than transistors.

BRIEF DESCRIPTION OF THE DRAWINGS

FIGS. 9-32 graphically illustrate various relationships described in the EXAMPLES.

DETAILED DESCRIPTION OF THE ILLUSTRATED EMBODIMENTS

Some embodiments include utilization of shallow boron implants in source/drain regions of NMOS devices to improve performance characteristics of such devices. The boron implants may be provided utilizing any suitable methodology, including, for example, PLAD (plasma doping). In some embodiments, shallow boron implants are provided simultaneously in source/drain regions of PMOS devices and NMOS devices to improve performance characteristics of CMOS. Utilization of a simultaneous implant into both PMOS devices and NMOS devices can avoid masks and associated cleaning steps, which can simplify processing and reduce costs. Example embodiments are described with reference to the accompanying figures.

Figure 1:
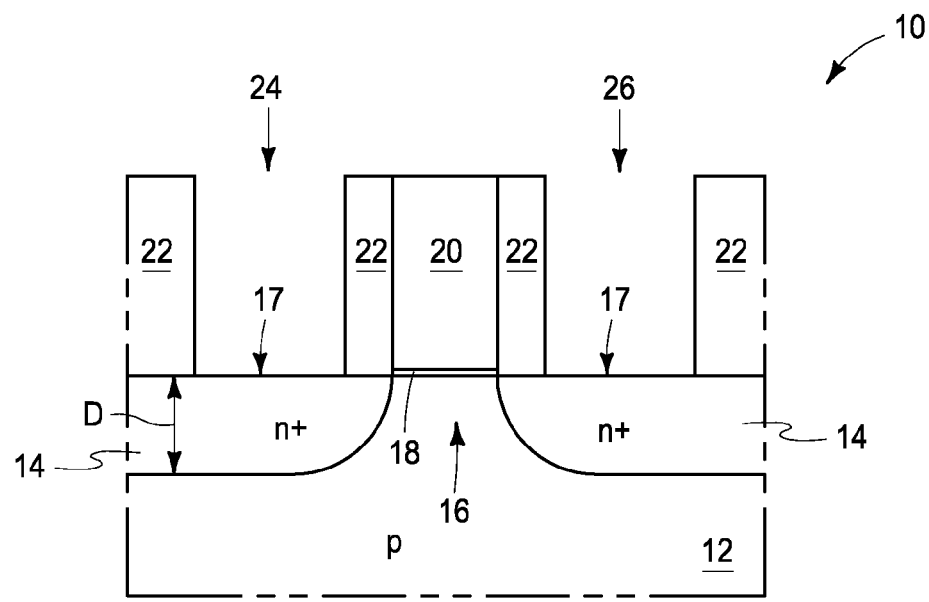
FIGS. 1-3 are diagrammatic cross-sectional views of an example construction comprising an example transistor at various process stages of an example embodiment.
Figure 2:
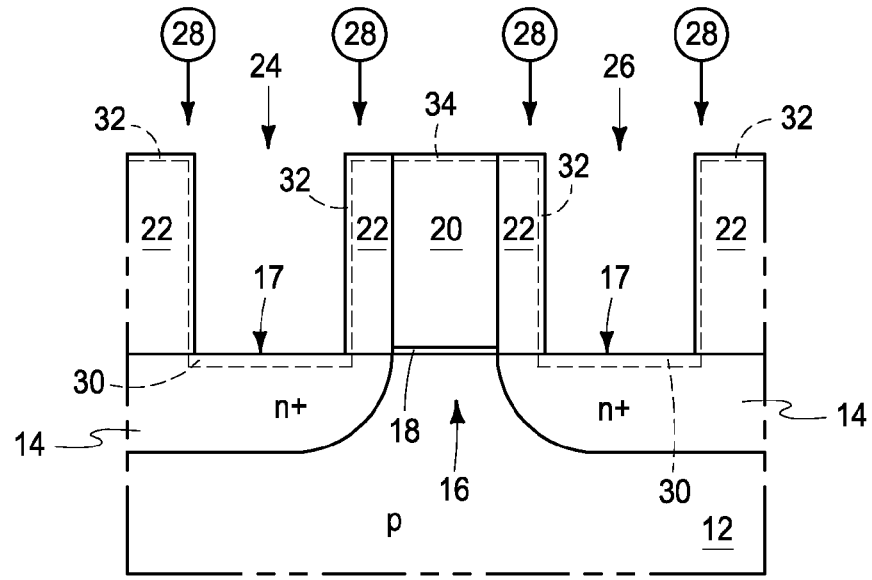
Figure 3:
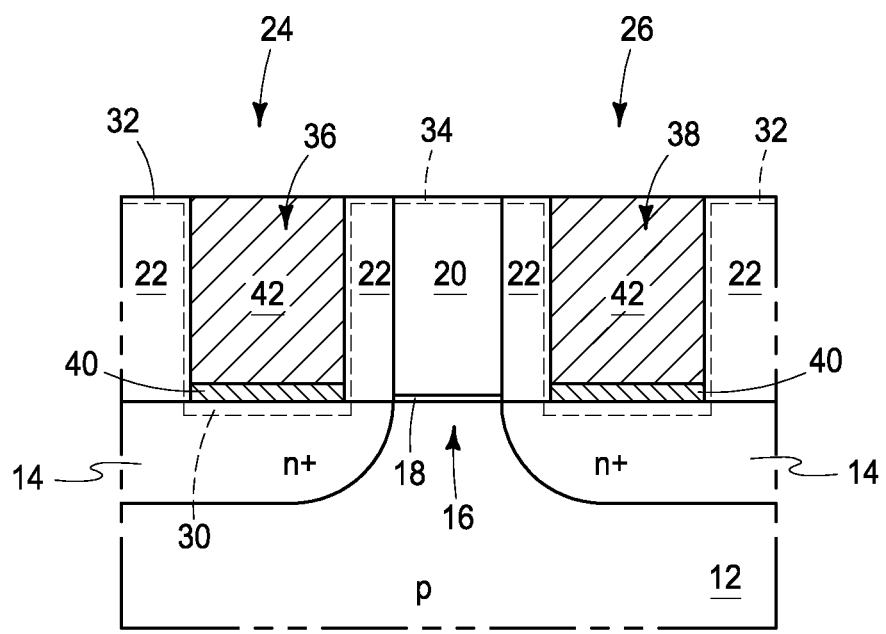

FIGS. 1-3 illustrate an example method of forming an example NMOS device.

Referring to FIG. 1, a construction 10 includes a lightly p-type doped base 12, and includes n-type doped source/drain regions 14 extending into the base. The source/drain regions 14 are example n-type doped diffusion regions. N-type doped diffusion regions may be used for other applications besides source/drain regions of transistors in other embodiments.

Base 12 may comprise semiconductor material, and in some embodiments may comprise, consist essentially of, or consist of monocrystalline silicon. In some embodiments, base 12 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, base 12 may correspond to a semiconductor substrate containing one or more materials associated with integrated circuit fabrication. Some of the materials may be under the shown region of base 12 and/or may be laterally adjacent the shown region of base 12; and may correspond to, for example, one or more of refractory metal materials, barrier materials, diffusion materials, insulator materials, etc.

The n-type source/drain regions 14 extend to any suitable depth "D"; and in some embodiments extend to a depth within a range of from about 5 nm (nanometers) to about 30 nm.

A channel region 16 extends between source/drain regions 14. Gate dielectric 18 is over the channel region, and a gate 20 is over the gate dielectric.

The gate dielectric 18 may comprise any suitable composition or combination of compositions; and in some embodiments may comprise one or more suitable oxides (for instance, silicon dioxide).

The gate 20 may comprise any suitable composition or combination of compositions. In some embodiments, the gate may comprise one or more conductive materials over the gate dielectric 18 (such conductive materials may include, for example, conductively-doped silicon and/or metal), and may comprise an electrically insulative cap over the conductive materials (such electrically insulative cap may include, for example, one or both of silicon dioxide and silicon nitride).

Dielectric material 22 is over base 12. Openings 24 and 26 extend through the dielectric material to upper surfaces 17 of the source/drain regions 14. The dielectric material 22 may comprise any suitable composition or combination of compositions; and in some embodiments may comprise, consist essentially of, or consist of silicon dioxide. In some embodiments, dielectric material 22 may be considered to correspond to dielectric structures, with such structures being directly against upper surfaces 17 of the source/drain regions.

Referring to FIG. 2, boron is implanted into source/drain regions 14 to form boron-doped regions 30 at upper portions of the source/drain regions. In some embodiments, the boron-doped regions 30 extend no more than about 10 nm into base 12. In such embodiments, the boron-doped regions may be entirely contained within the top half of the n-type doped regions 14 (i.e., the boron-doped upper portions of the n-type doped source/drain regions may comprise less than or equal to about one-half of a total depth of the n-type doped source/drain regions). The concentration of boron within the boron-containing regions 30 may be within a range of from about one atomic percent to about 10 atomic percent; and in some embodiments may be within a range of from about one atomic percent to about five atomic percent.

The boron is implanted utilizing a boron-containing species 28. In some embodiments, the implanting of boron utilizes PLAD, and the boron-containing species comprises $B_2H_6$ and/or $BF_3$. The PLAD may utilize any suitable conditions; and in some embodiments utilizes energy of from about 0.1 kV to about 10 kV, with a dose of boron-containing species of from about $(0.1 \times 10^{16})/cm^2$ to about $(5 \times 10^{16})/cm^2$.

In the shown embodiment, an entirety of the n-type doping of source/drain regions 14 is conducted before forming boron-doped regions 30. Such may be advantageous in some applications, in that boron may diffuse if the boron-doped regions are formed prior to n-type doping of the source/drain regions. However, in other applications it may be desired to perform at least some of the n-type doping of the source/drain regions after forming the boron-doped regions.

In the shown embodiment, the implant forms altered regions adjacent exterior surfaces of dielectric material 22, and adjacent an exposed upper surface of the electrically insulative cap of gate 20. Such altered regions are diagrammatically illustrated as regions 32 within dielectric material 22, and region 34 along the upper surface of gate 20.

The altered regions 32 and 34 may include one or more components from the implanted species 28. For instance, in some embodiments boron from species 28 may be implanted within regions 32 and 34. The boron may be present within such regions to a concentration within a range of from about one atomic percent to about 10 atomic percent, and in some embodiments may be present to within a range of from about one atomic percent to about five atomic percent. In some embodiments, regions 32 and 34 may extend into material 22 and gate 20 no further than about 10 nm from outer peripheries of the material 22 and gate 20. In some embodiments, the boron-containing regions 30 may be referred to as first boron-doped regions, the regions 32 may be referred to as second boron-doped regions, and the region 34 may be referred to as a third boron-doped region.

In some embodiments, it may be another component of species 28 implanted into regions 32 (and possibly region 34) other than, or in addition to, boron. For instance, in some embodiments the implant species 28 comprises $BF_3$, and fluorine is implanted into regions 32 (and possibly region 34). The fluorine may reduce positive charges within dielectric material 22. Such may be advantageous, in that one mechanism for degradation of an NMOS device is through deactivation resulting from interaction of electrons in n-type doped material with positive charges of adjacent dielectric material. Utilization of the fluorine to reduce positive charges within the dielectric material can thereby eliminate, or at least reduce, such mechanism of degradation. The fluorine may also improve radiation hardness during utilization of plasma-based processes that may be utilized at back-end-of-line (BEOL) processing.

If fluorine is introduced into regions 32, such may ultimately diffuse beyond the illustrated regions 32 to alleviate positive charges throughout dielectric material 22.

In some embodiments, boron dopant within region 30 may reduce electron loss into dielectric material 22, and accordingly may function synergistically with fluorine in dielectric material 22 to eliminate, or at least reduce, deactivation mechanisms involving interaction of electrons from n-type region 14 with positive charges in dielectric material 22.

The dielectric structures 22 may be considered to comprise outer peripheries, and in some embodiments, altered regions 32 may extend inward no further than about 10 nanometers from said outer peripheries. In some embodiments, openings 24 and 26 may be considered to expose side surfaces of structures 22 and parts of the upper surfaces of diffusion regions 14. The boron-doped regions 30 reach the exposed parts of the upper surfaces of the diffusion regions. The altered regions 32 extend continuously to boron-doped regions 30. The boron doped regions 30 and 32 have substantially the same boron concentration as on another.

Referring to FIG. 3, electrically conductive contacts 36 and 38 are formed within openings 24 and 26. Such electrically conductive contacts may comprise any suitable electrically conductive composition or combination of compositions. In the shown embodiment, the electrically conductive contacts comprise a first conductive material 40 directly against the upper surfaces of n-type regions 14, and comprise a second conductive material 42 over the first conductive material. The first conductive material 40 may comprise, for example, metal silicide (for instance, tungsten silicide, titanium silicide, cobalt silicide, etc.), and the second conductive material 42 may comprise metal (for instance, tungsten, titanium, cobalt, etc.) and/or metal-containing compositions (for instance, metal carbide, metal nitride, etc.). In some embodiments, metal 42 is formed within openings 24 and 26, and silicide 40 results from chemical interaction of metal from material 42 with silicon of base 12. In some embodiments, at least some of the boron from region 30 may become incorporated into silicide 40. In the shown embodiment, the silicide 40 is directly against boron-containing region 30.

In the shown embodiment, the conductive contacts 36 and 38 have upper surfaces approximately coplanar with upper surfaces of insulative material 22 and gate 20. In other embodiments, the conductive contacts may have upper surfaces which are above or below the illustrated upper surfaces of gate 20 and dielectric material 22. The upper surfaces of dielectric material 22 may be coplanar with upper surfaces of gate 20 (as shown), or may not be coplanar with the upper surfaces of the gate in other embodiments.

Incorporation of boron into upper portions of n-type doped regions 14 is found to improve performance characteristics of NMOS devices (as described in more detail in the EXAMPLES that follow). Some of the observed improvement may result from reduction of deactivation mechanisms, as described above. A possible additional, or alternative, mechanism for some of the observed improvement is that Schottky barrier heights (SBH) associated with the interfaces of conductive contacts 36 and 38 with n-type regions 14 are lowered.

Figure 4:
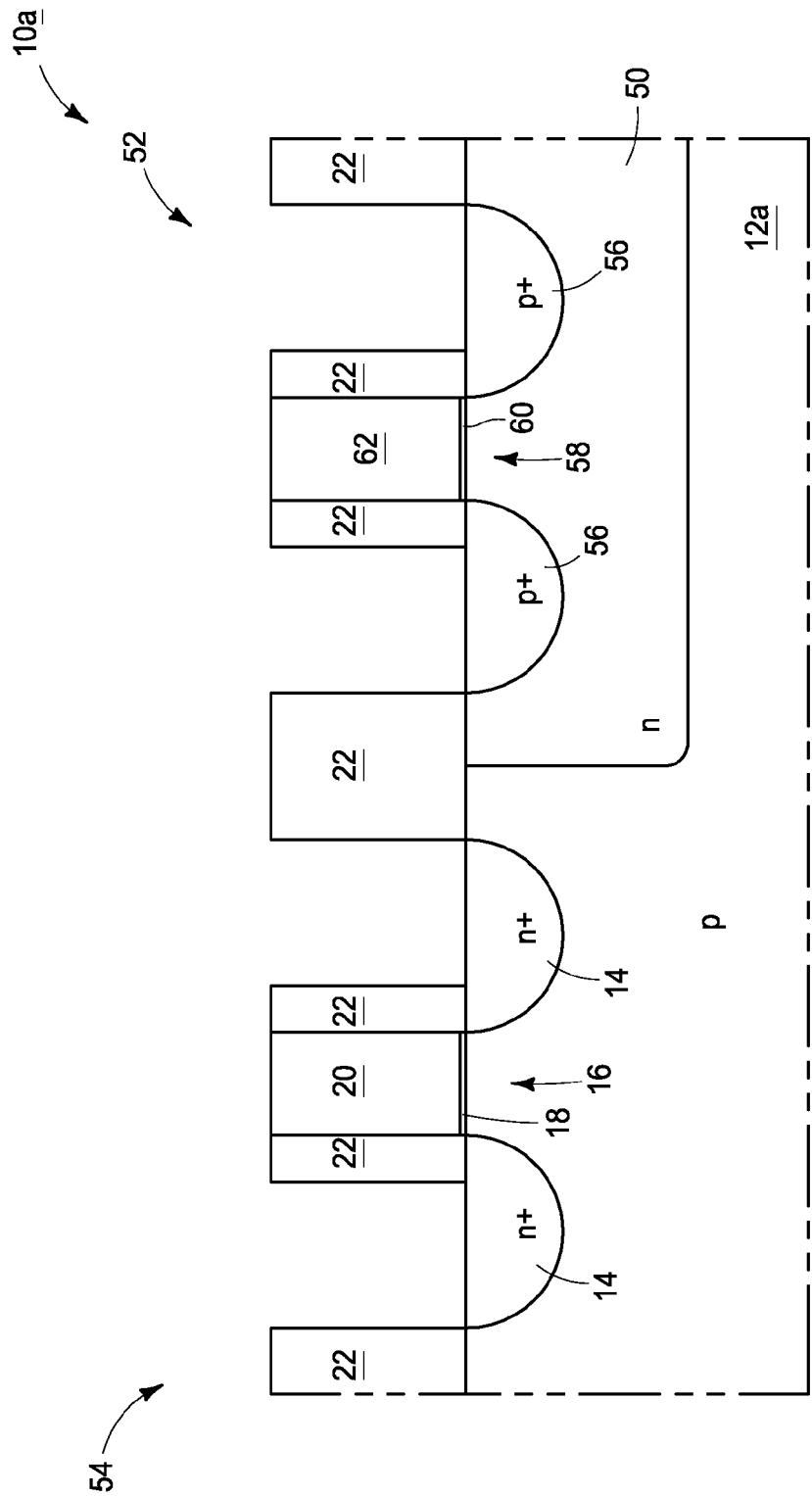
FIGS. 4-6 are diagrammatic cross-sectional views of an example construction comprising example CMOS (complementary metal-oxide-semiconductor) at various process stages of an example embodiment.
Figure 5:
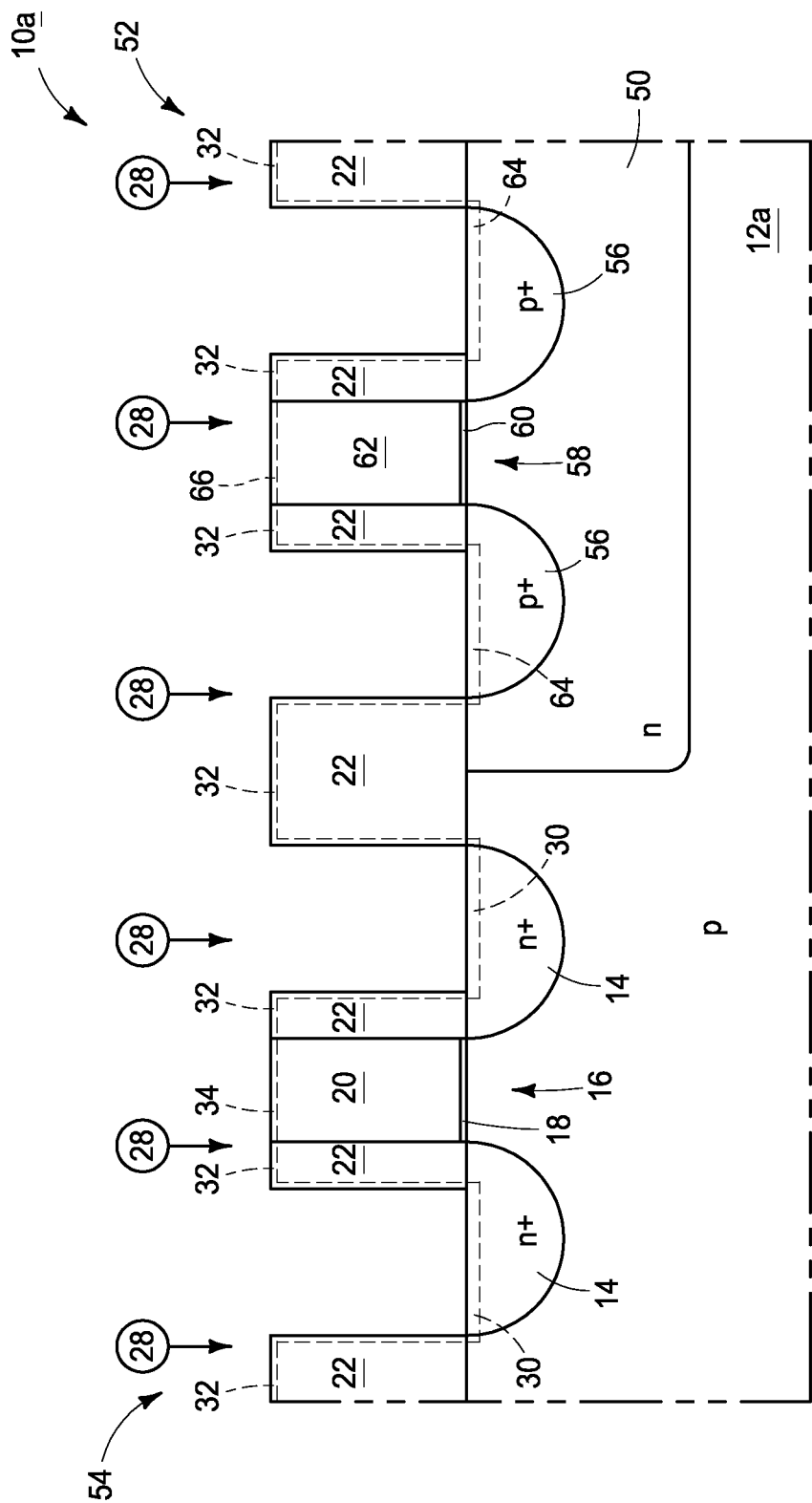
Figure 6:
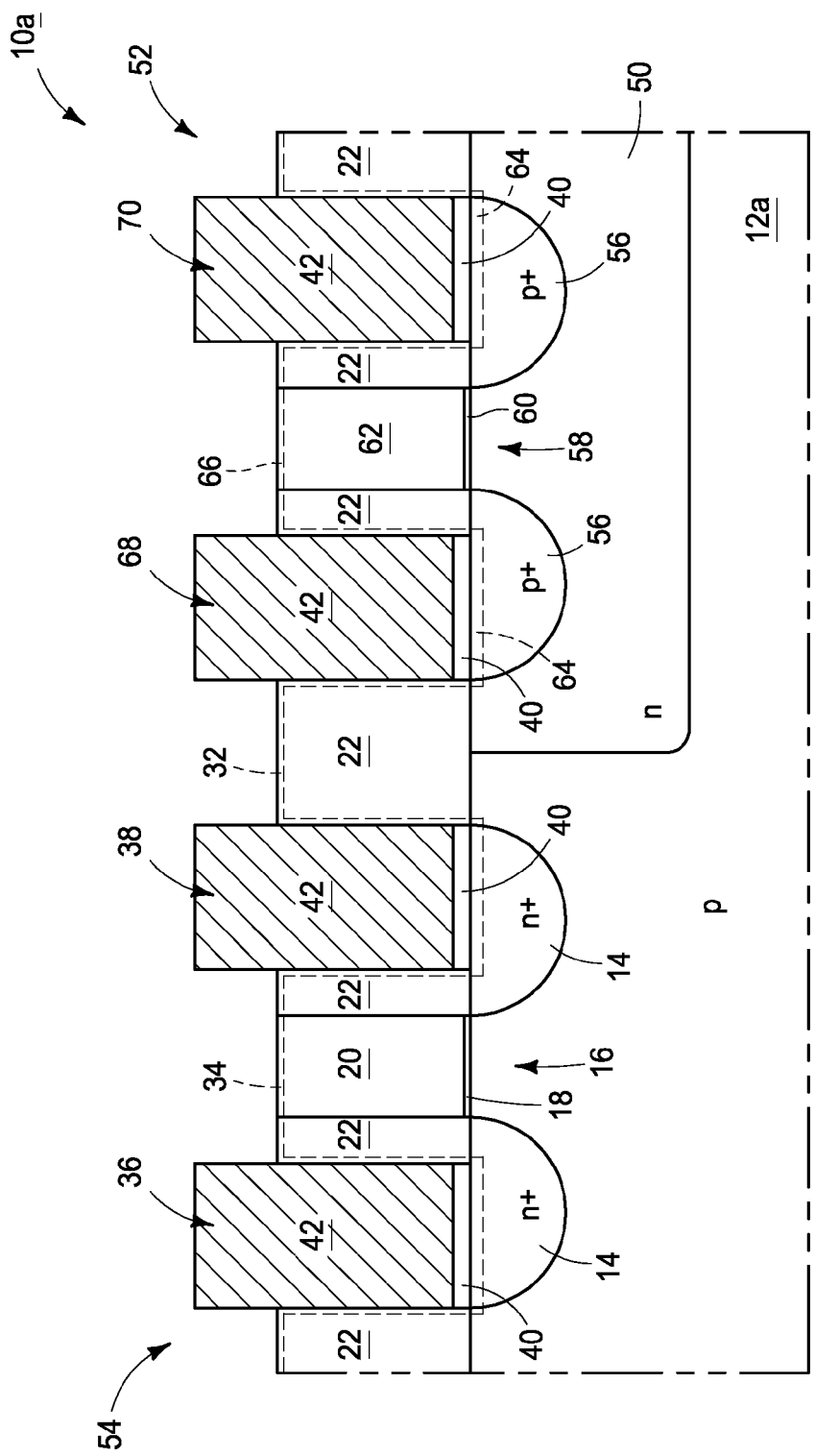

FIGS. 4-6 illustrate an example method of forming a CMOS device.

Referring to FIG. 4, a construction 10a includes a base 12a having an n-well 50 extending therein. The base 12a may comprise any of the materials described above relative to the base 12 of FIG. 1.

A PMOS structure 52 is over the n-well region of base 12a, and an NMOS structure 54 is over an adjacent region of base 12a. The NMOS structure comprises materials described above with reference to FIG. 1. The PMOS structure comprises p-type doped source/drain regions 56, a channel region 58 between the source/drain regions, a gate dielectric 60 over the channel region, and a gate 62 over the gate dielectric. The gate dielectric 60 and gate 62 may comprise materials analogous to those described above with reference to gate dielectric 18 and gate 20. A first pair of openings extends through material 22 to n-type diffusion regions 14, and a second pair of openings extends through material 22 to p-type diffusion regions 56. The openings may be considered to be first, second, third and fourth openings in some embodiments.

Referring to FIG. 5, a boron-containing species 28 is utilized to implant boron into source/drain regions 14 and 56 with processing analogous to that described above with reference to FIG. 2.

The boron implant forms boron-doped regions 30 at upper portions of the n-type source/drain regions 14, and forms boron-doped regions 64 at upper portions of the p-type source/drain regions 56. In some embodiments, the boron-doped regions 30 and 64 may be referred to as first and second boron-enhanced regions, respectively. In some embodiments, the boron-enhanced regions 30 and 64 extend no more than about 10 nm into base 12. In such embodiments, the boron-enhanced regions may be entirely contained within the top half of the n-type doped regions 14 and p-type doped regions 56. The concentration of boron within the boron-enhanced regions 30 and 64 may be within a range of from about one atomic percent to about 10 atomic percent; and in some embodiments may be within a range of from about one atomic percent to about five atomic percent.

In some embodiments, the implanting of boron utilizes PLAD, and the boron-containing species comprises $B_2H_6$ or $BF_3$. The PLAD may utilize any suitable conditions; and in some embodiments utilizes energy of from about 0.1 kV to about 10 kV, with a dose of boron-containing species of from about $(0.1\times10^{16})/cm^2$ to about $(5\times10^{16})/cm^2$.

In the shown embodiment, the implant forms altered regions 32 within dielectric material 22, altered region 34 along the upper surface of gate 20, and an altered region 66 along the upper surface of gate 62. Region 66 may comprise the same components as discussed above with reference to regions 32 and 34.

The implant into the NMOS device 54 may provide advantages of the types described above with reference to FIGS. 2 and 3. Further, boron-enhanced regions 64 may improve performance of the PMOS device 52; including, lowering contact resistances and improving drive current. Specific example improvements are described in more detail below with reference to the EXAMPLES.

Referring to FIG. 6, electrically conductive contacts 68 and 70 are formed in addition to contacts 36 and 38. The contacts 36, 38, 68 and 70 extend above surfaces of dielectric material 22 and gates 20 and 62 in the shown embodiment. In other embodiments, the contacts may have upper surfaces coplanar with upper surfaces of dielectric material 22 and gates 20 and 62, or below upper surfaces of dielectric material 22 and gates 20 and 62. Also, in other embodiments the dielectric material 22 and gates 20 and 62 may have other configurations than the illustrated configuration; and, for example, may not have upper surfaces coplanar with one another.

The processing of FIGS. 4-6 simultaneously implants boron into both PMOS device 52 and NMOS device 54, which eliminates masking steps as compared to processes which selectively implant dopant into one or the other of the PMOS and NMOS devices. Further, the processing of FIGS. 4-6 may simultaneously form conductive contacts 36, 38, 68 and 70 within both of the NMOS and PMOS devices, which may also eliminate masking steps as compared to processes which sequentially form contacts in one of the PMOS and NMOS devices prior to forming the contacts in the other of the PMOS and NMOS devices. The elimination of masking steps may reduce processing time and expense.

Figure 7:
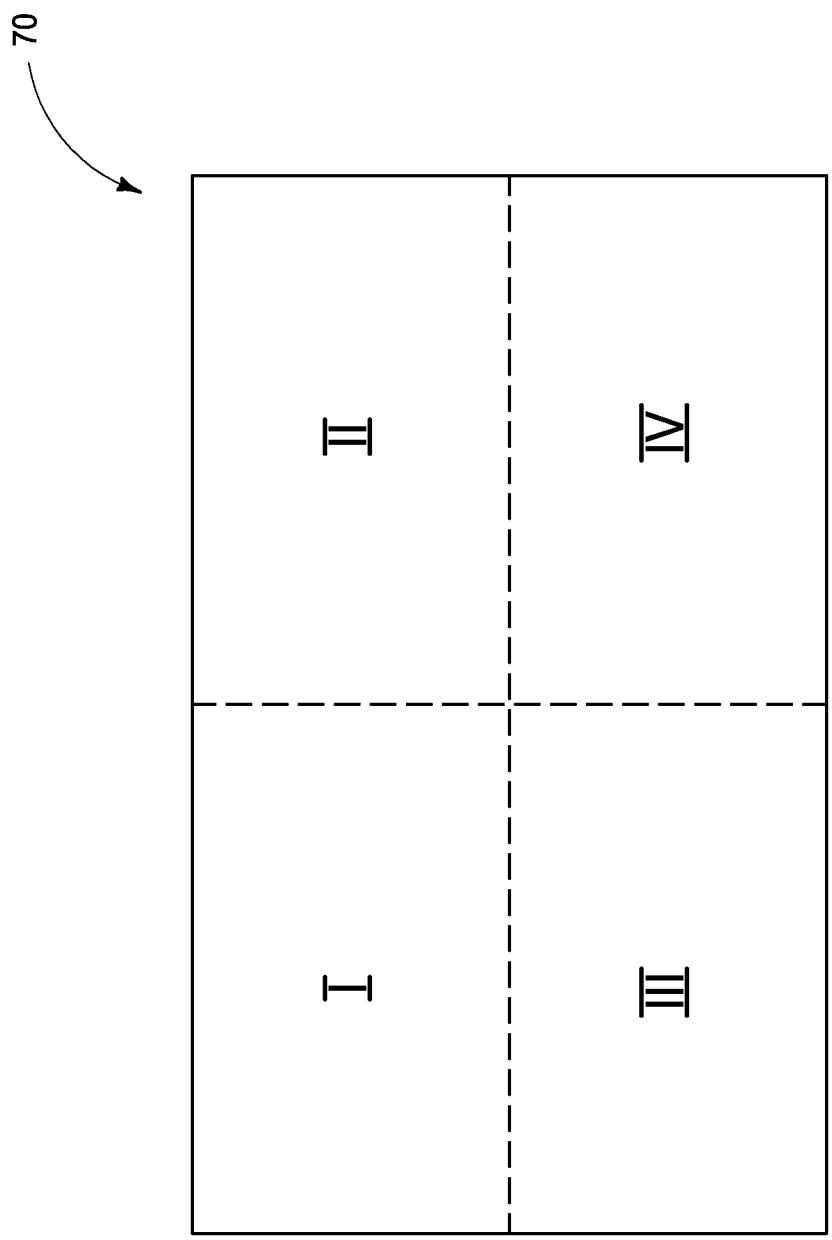
FIG. 7 is a diagrammatic top view of a portion of an example semiconductor die showing an example arrangement of different regions.

In some embodiments, the boron implant may be conducted across multiple regions of a semiconductor substrate without additional masking FIG. 7 shows an example substrate 70 comprising multiple regions I-IV. Approximate boundaries of the regions are diagrammatically illustrated with dashed-lines. The regions may comprise any of various devices and structures associated with integrated circuit fabrication. For instance, the regions may correspond to memory, logic, redistribution architecture, wiring, wordline contact areas, bitline contact areas, etc.

Figure 8:
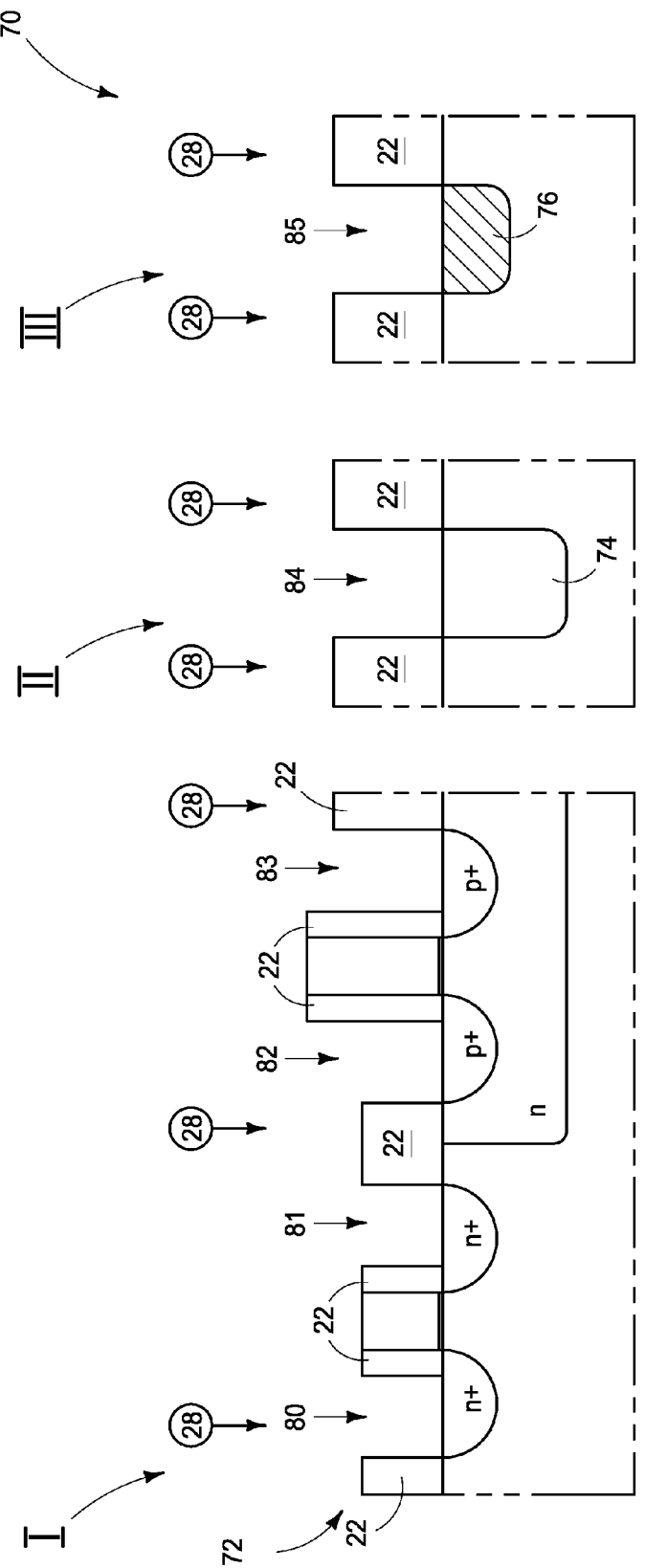
FIG. 8 shows diagrammatic cross-sectional views of example segments of regions of the die of FIG. 7 at a process stage of an example embodiment.

FIG. 8 diagrammatically illustrates cross-sections within example regions I-III, with such regions comprising CMOS architecture 72, a semiconductor material plug 74, and a metal-containing wiring material 76. In some example embodiments, the semiconductor material plug 74 may correspond to a redistribution layer, and the metal-containing material 76 may correspond to a wordline or bitline.

The dielectric material 22 extends across regions I-III, and defines a plurality of contact openings 80-85 to the various structures associated with the regions.

Boron is simultaneously implanted into all of the contact openings 80-85 utilizing species 28. In some embodiments, such implanting may comprise PLAD methodology of the type described above with reference to FIGS. 2 and 5. The boron improves the CMOS architecture 72 for reasons described above with reference to FIGS. 1-6. The boron implant may also improve properties of semiconductor material 74 for reasons analogous to the reasons for improvement of the CMOS architecture. The boron does not detrimentally impact metal-containing material 76, and accordingly exposure of such material to boron is not problematic. Accordingly, all of the regions I-III may be exposed to the boron implant to achieve some advantages, and no disadvantages. Thus, masking may be eliminated. Further, in subsequent processing electrically conductive contacts may be simultaneously formed in all of openings 80-85, which can save time and expense as compared to processes that form one or more of such contacts sequentially relative to others of the contacts.

The methods and structures described herein may have application to, for example, DRAM, NAND, logic, CMOS, emerging memory, etc. The methods and structures described herein are accordingly not limited to the source/drain regions of a transistor, but may be applied to any N-type diffusion region that may be used in DRAM, NAND, logic, CMOS, emerging memory, etc.

The various devices and structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some advantages that may be achieved with the embodiments described herein are described with reference to specific EXAMPLES that follow.

EXAMPLES

Example 1

The standard CMOS circuit, including PMOS and NMOS devices, is fabricated as a self-aligned poly gate structure. The in-situ n-type doped poly-Si gate is deposited by a LPCVD process for the NMOS device, and counter-doped by P+ (boron-based) plasma doping (PLAD) for the PMOS device. The raised source and drain (SD) regions are formed by a boron-based PLAD implant and a beam-line arsenic (As) implant for PMOS and NMOS devices, respectively. After the SD implants, the wafers are subjected to stripping, cleaning and rapid thermal-annealing processing (RTP) to activate the impurities. After the SD regions are formed, there are several process steps such as oxide and nitride depositions, contact area etching and cleaning, etc. Then the flood BC implant is conducted across the contact areas of the both PMOS and NMOS SD regions without masks. Metal contacts are formed by standard Ti/W-based metallization.

Electrical characterization is performed after the final DRAM circuit processing is completed.

Table I provides an experiment matrix. 1C is a control group without BC implant, and corresponds to Process of Record (POR)—i.e., prior art. 2E is a group with $BF_3$ ultra-low energy (ULE) PLAD (using about $0.5$ kV/$1\times10^{16}$/$cm^2$, which is equivalent to about $0.2$ kV/$1\times10^{16}$/$cm^2$ of a conventional beam-line implant), and chosen for the deactivation characterization.

TABLE I

MATRIX TABLE OF FLOOD BC IMPLANT EXPERIMENTS

| Flood BC Implant | CMOS SD Implant |
| --- | --- |
| 1C -- POR (None) | NMOS $N^+$ SD - As BL implant |
|  | PMOS $P^+$ SD - $B_2H_6$ PLAD |
| 2E -- ULE $BF_3$ PLAD | NMOS $N^+$ SD - As BL implant |
|  | PMOS $P^+$ SD - $B_2H_6$ PLAD |

NMOS Device Performance

Figure 9:
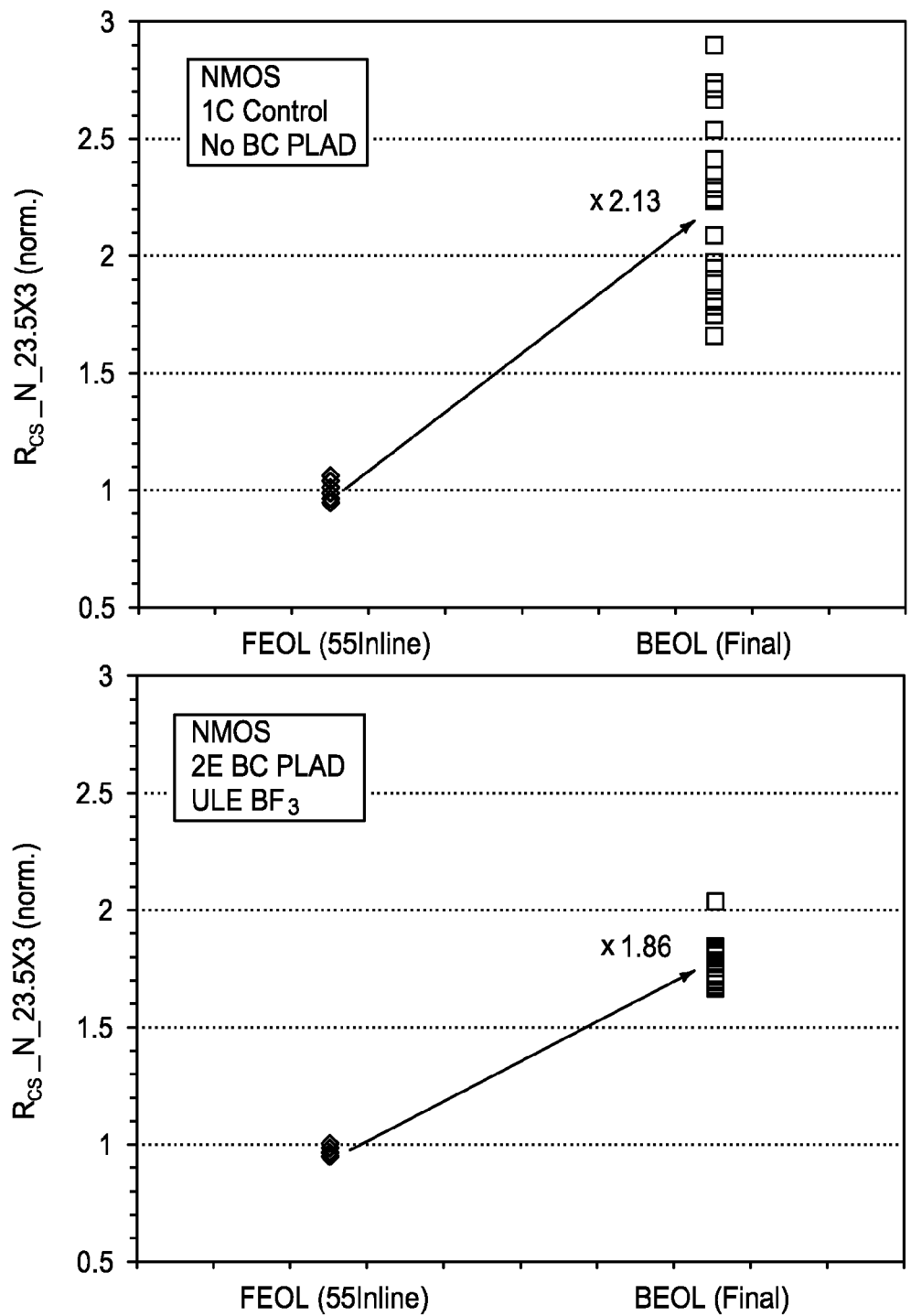

FIG. 9 compares contact resistance $R_{CS}$ of a large contact area SD (W×L: about 23.5×3) with metal conductive interconnects of the NMOS device between FEOL and BEOL, (top) 1C control group, and (bottom) 2E experimental group. $R_{CS}$ of 1C shows deactivation by an increase of ×2.13 from FEOL to BEOL. 2E shows less deactivation than 1C with an increase of ×1.86.

Figure 10:
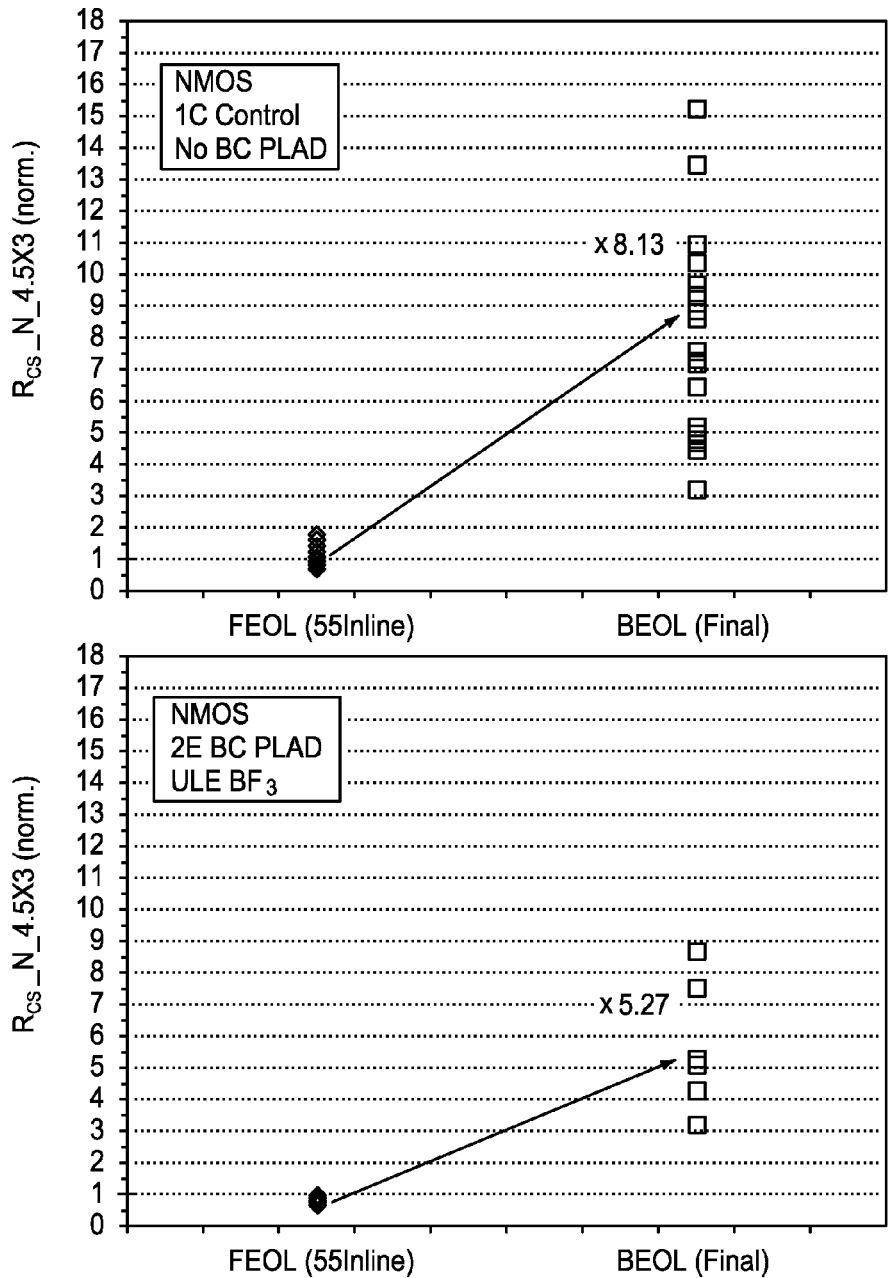

FIG. 10 compares contact resistance $R_{CS}$ of a small contact area SD (W×L: about 4.5×3) of the NMOS device between FEOL and BEOL, (top) 1C control group, and (bottom) 2E experimental group. $R_{CS}$ of the small contact area SD shows more serious deactivation than the larger contact area SD by an increase of ×8.13 from FEOL to BEOL for 1C. 2E shows less deactivation than 1C with an increase of only ×5.27.

Several interesting features are observed. First, 2E shows less deactivation than 1C, and a more significant difference for small contact area devices. Second, 2E shows tighter distribution of $R_{CS}$ than 1C on both large and small contact areas at BEOL. The above features demonstrate that a ULE $BF_3$ PLAD process significantly improves deactivation of the NMOS device. $R_{CS}$ of a small contact area NMOS device is further improved (reduced) from ×0.74 at FEOL to ×0.51 at BEOL. Third, the enhanced deactivation improvement for the small contact area device implies that deactivation occurs at the interface of SD and spacer, and the deactivation improvement for $R_{CS}$ mainly occurs at the edge region of the contact area. Deactivation and its improvement are strongly dependent on perimeters of the interface of SD and spacer, not on bulk contact area because the small area contact has a larger perimeter/area ratio than the large area contact.

Figure 11:
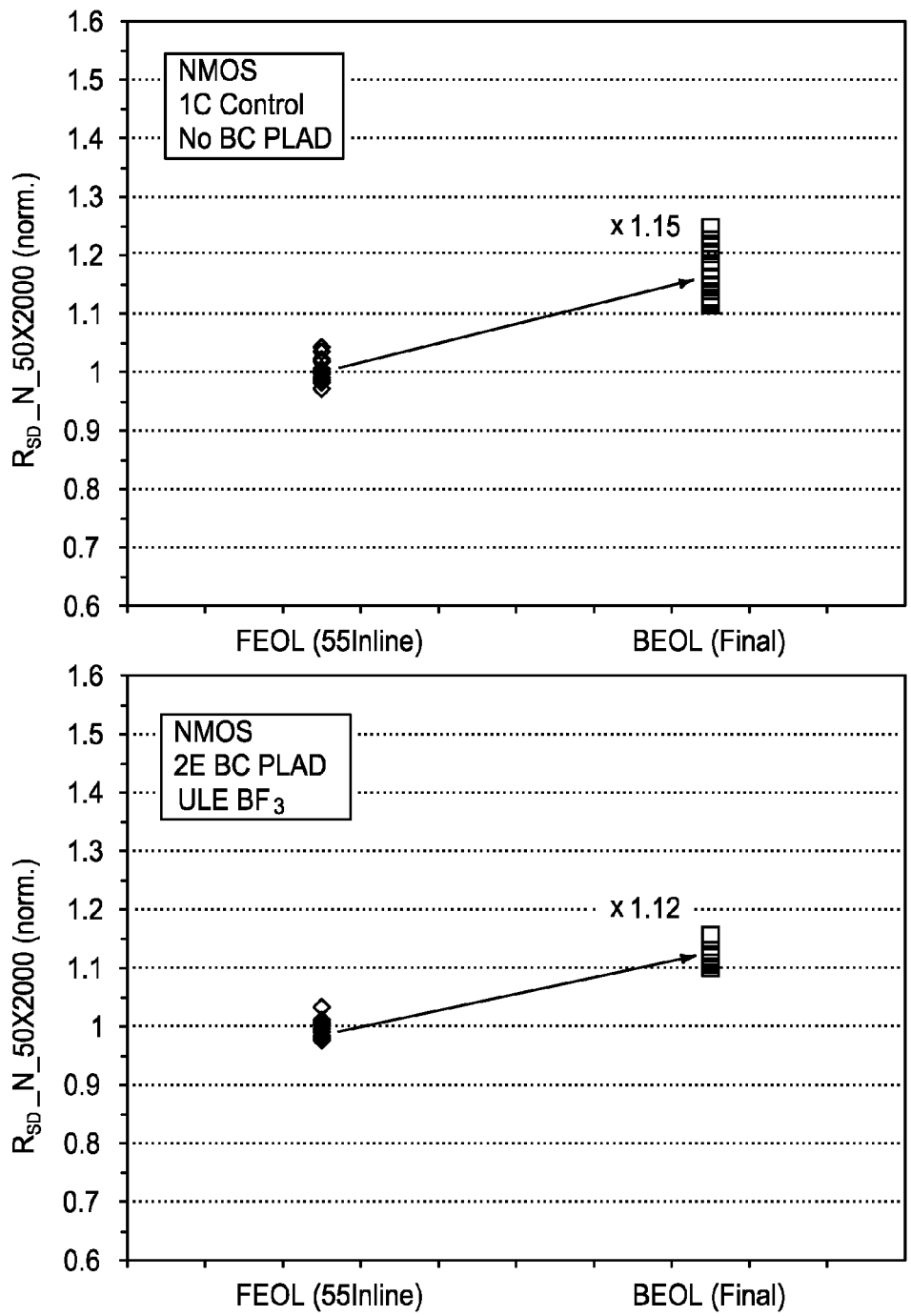

FIG. 11 compares series resistance $R_{SD}$ of a large area SD (W×L: about 50×2000) of the NMOS device between FEOL and BEOL, (top) 1C control group, and (bottom) 2E experimental group. $R_{SD}$ of 1C shows deactivation by an increase of ×1.15 from FEOL to BEOL. 2E shows similar (slightly less) deactivation than 1C with an increase of ×1.12.

Figure 12:
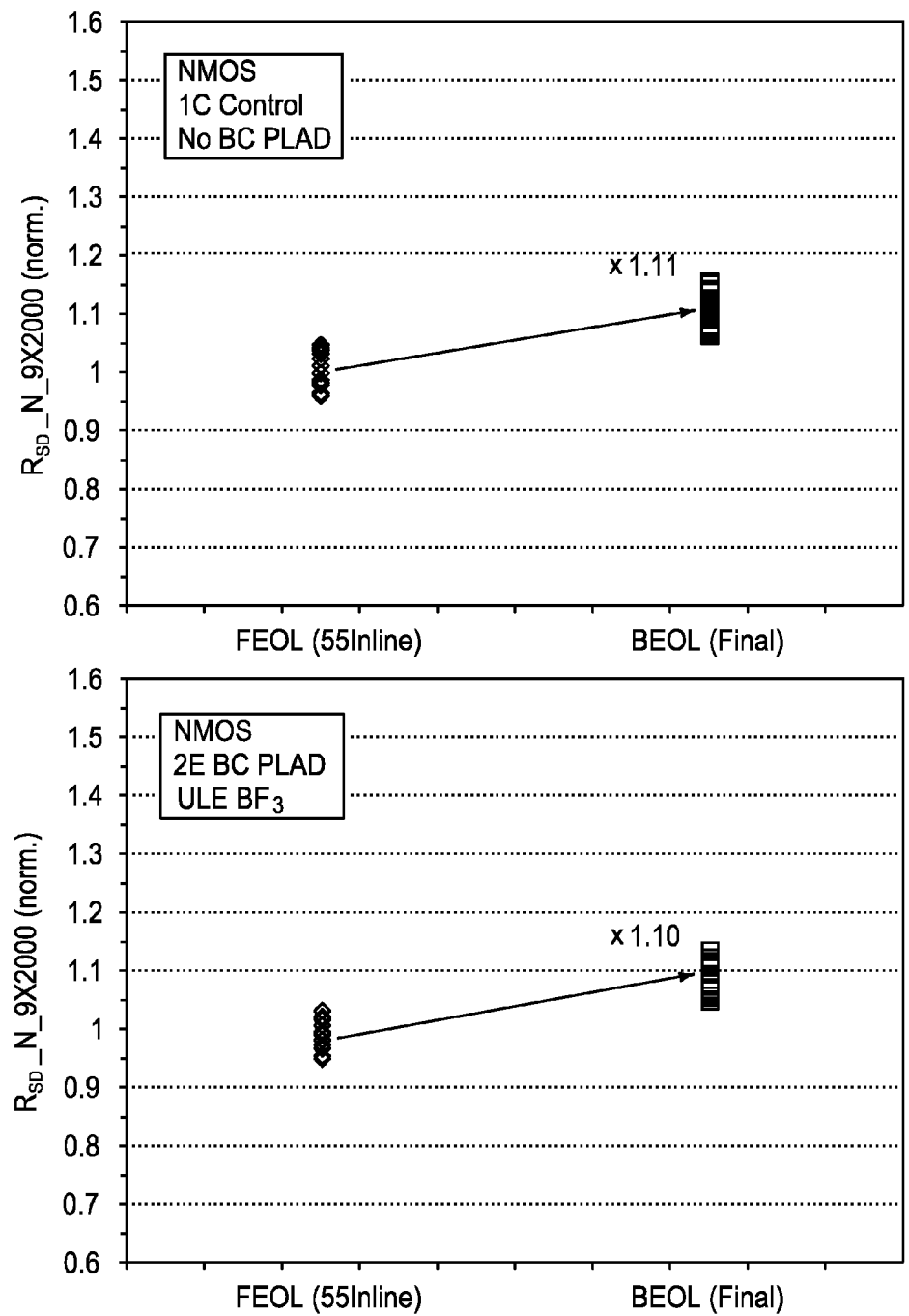

FIG. 12 compares series resistance $R_{SD}$ of a small area SD (W×L: about 9×2000) of the NMOS device between FEOL and BEOL, (top) 1C control group, and (bottom) 2E experimental group. $R_{SD}$ of 1C of the small area SD shows an increase of ×1.11 from FEOL to BEOL. 2E shows similar deactivation with an increase of ×1.10. As compared to $R_{CS}$ cases, $R_{SD}$ shows less deactivation, and less deactivation improvement by 2E. Another interesting feature is that $R_{SD}$ deactivation and its improvement show little dependence on SD area. This implies and confirms that deactivation occurred at the interface of SD and spacer, and deactivation improvement mainly occurred at the edge of contact area; and strongly depends on perimeters of the contact area, not on bulk contact area.

Figure 13:
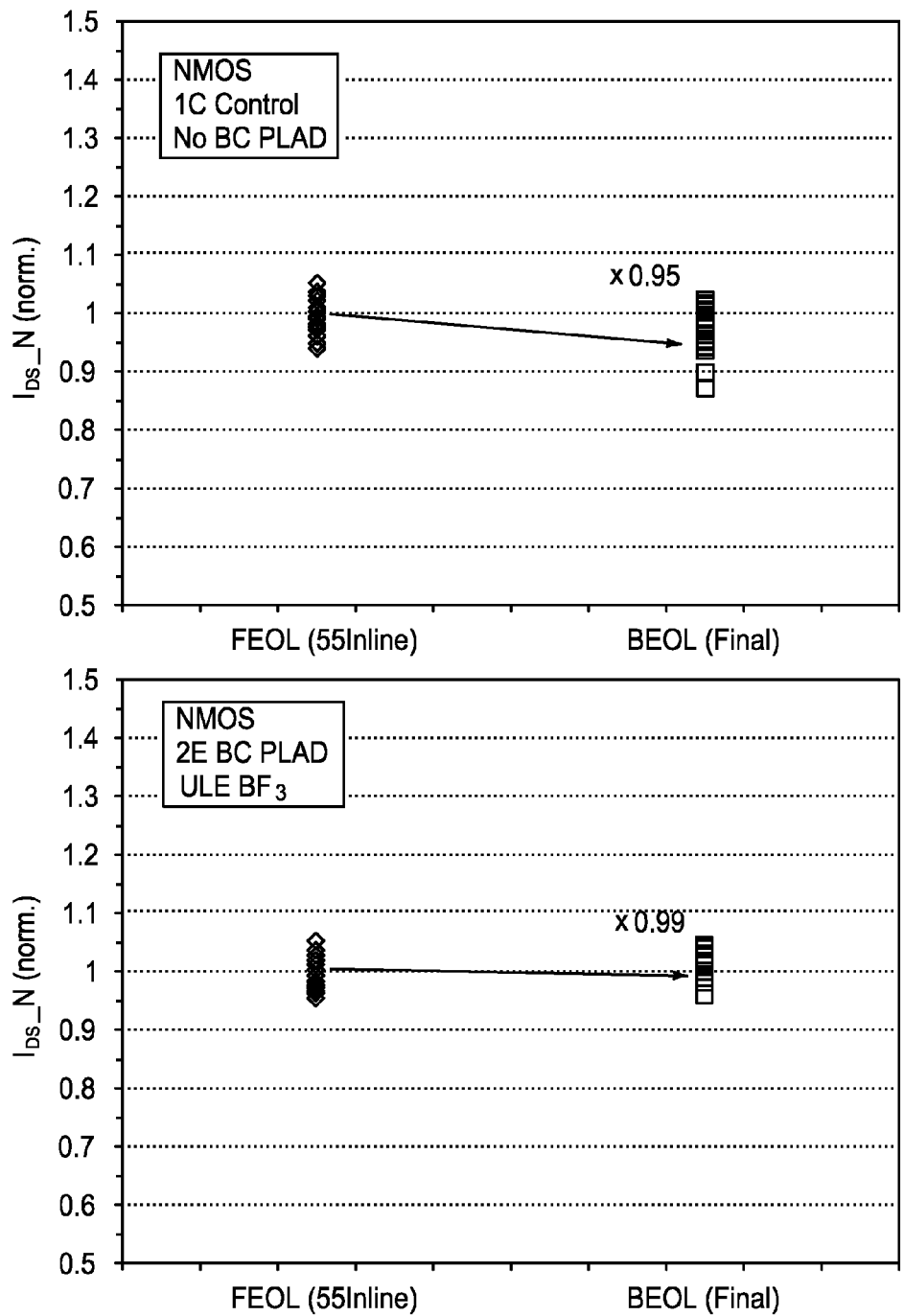

FIG. 13 compares drive current, $I_{DS}$, of a standard (W×L: about 80×1) NMOS device between FEOL and BEOL, (top) 1C control group, and (bottom) 2E experimental group. $I_{DS}$ show less deactivation than $R_{CS}$. Such may be due to a combination of $R_{CS}$ and $R_{SD}$ increases caused by dopant loss and effective channel length ($L_{eff}$) reduction caused by more lateral diffusion. 2E shows less deactivation than 1C by ×0.99 versus ×0.95 of 1C. 2E also shows a tighter $I_{DS}$ distribution than 1C.

Figure 14:
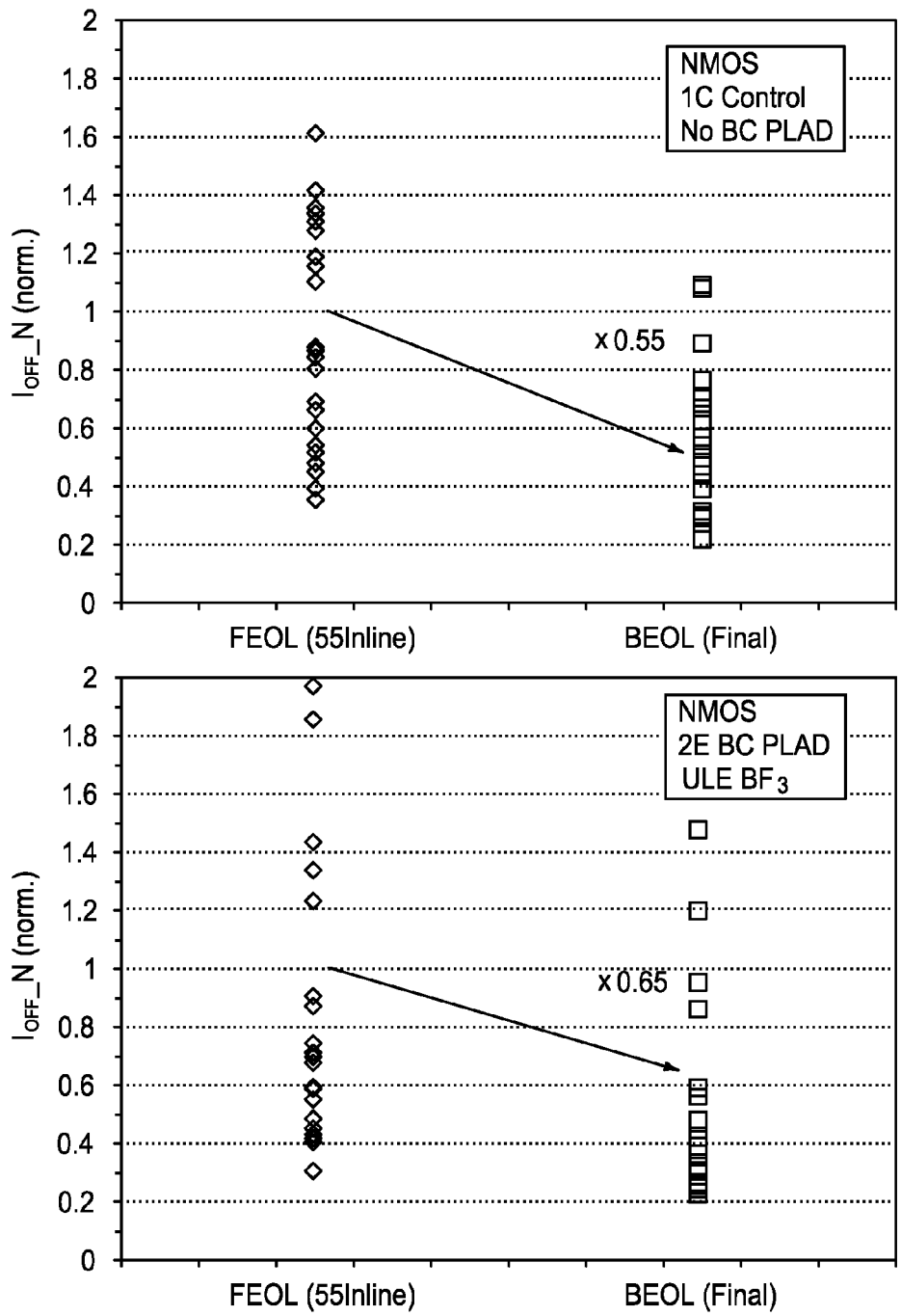

FIG. 14 compares off current ($I_{OFF}$) of a standard (W×L: about 80×1) NMOS device between FEOL and BEOL, (top) 1C control group, and (bottom) 2E experimental group. $I_{OFF}$ shows no degradation (actually improvement). Such may be due to a combination of $R_{CS}$ increase caused by dopant loss and $L_{eff}$ reduction caused by more lateral diffusion. The dopant loss may have more significant impact than $L_{eff}$ reduction on $I_{OFF}$ for an NMOS device. This can be confirmed as $I_{OFF}$ of 1C shows ×0.55 reduction, but $I_{OFF}$ of 2E shows slightly less reduction (×0.65 reduction); possibly because 2E has less deactivation (dopant loss) than 1C.

PMOS Device Performance

Figure 15:
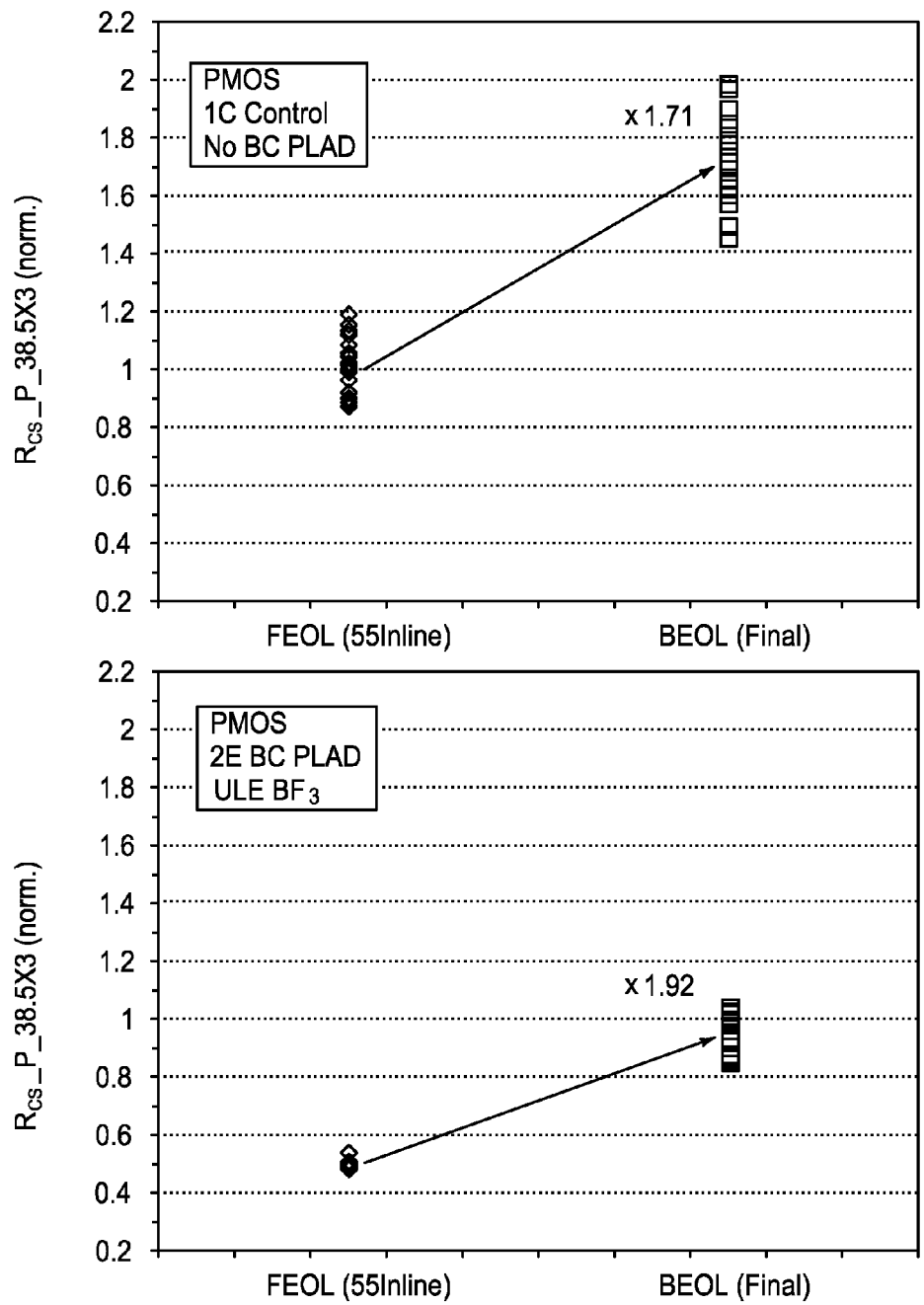

FIG. 15 compares contact resistance $R_{CS}$ of a large contact area SD (W×L: about 38.5×3) with metal conductive interconnects of the PMOS device between FEOL and BEOL, (top) 1C control group, and (bottom) 2E experimental group. $R_{CS}$ of 1C shows deactivation by an increase of ×1.71 from FEOL to BEOL. 2E shows similar and slightly greater deactivation than 1C with an increase of ×1.92.

Figure 16:
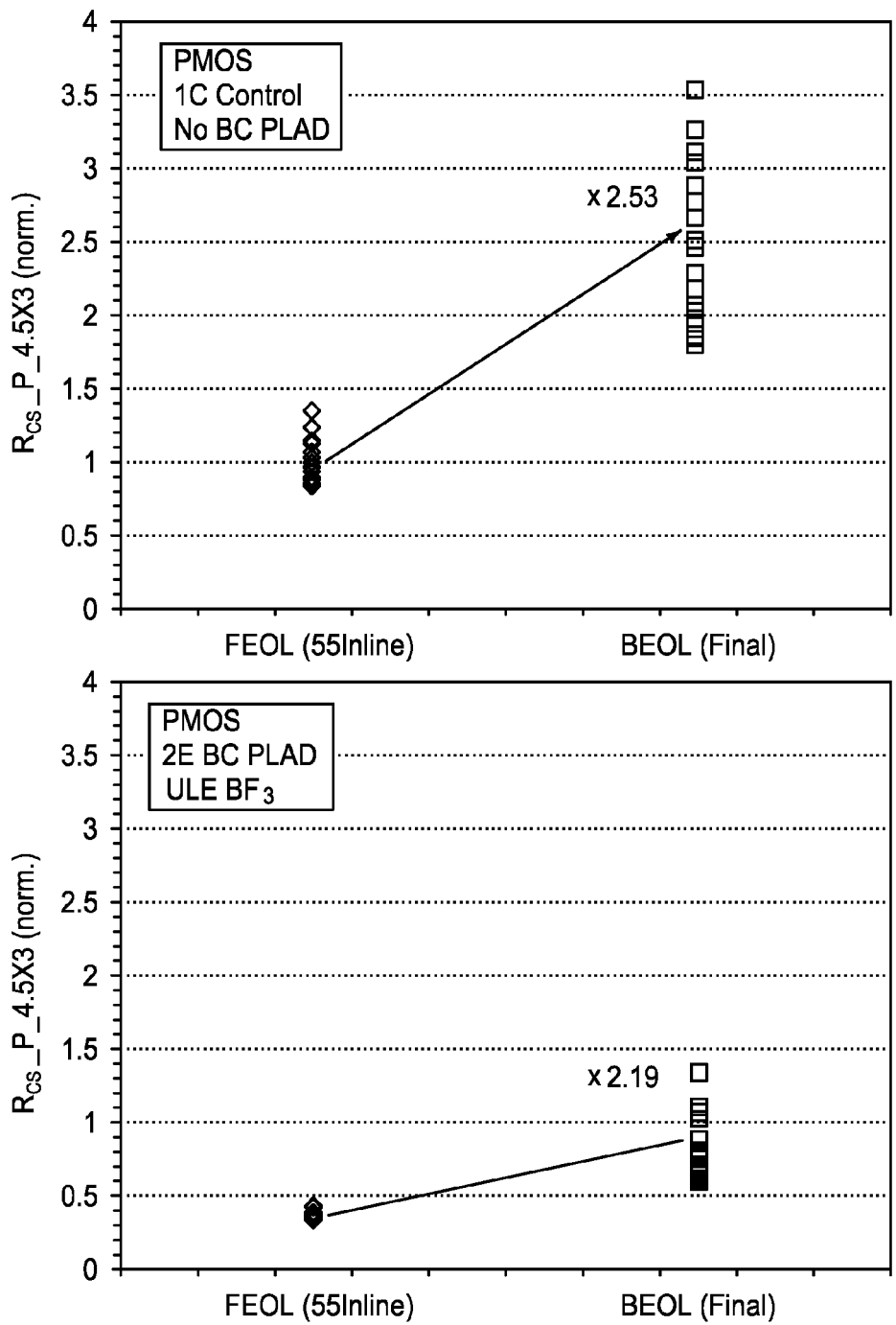

FIG. 16 compares contact resistance $R_{CS}$ of a small contact area SD (W×L: about 4.5×3) of the PMOS device between FEOL and BEOL, (top) 1C control group, and (bottom) 2E experimental group. $R_{CS}$ of the small contact area SD shows slightly more deactivation than the larger contact area SD by an increase of ×2.53. 2E shows less deactivation than 1C with an increase of only ×2.19.

Several interesting features are observed. The PMOS device shows less deactivation than the NMOS device, especially for the small contact area SD. For the small contact area (W×L: about 4.5×3), PMOS devices show $R_{CS}$ increases by ×2.53 and ×2.19 for 1C and 2E, respectively. These $R_{CS}$ deactivations of PMOS devices are much less than those of NMOS devices which show $R_{CS}$ increases by ×8.13 and ×5.27 for 1C and 2E, respectively. As compared to NMOS cases, 2E of the PMOS device does not show deactivation improvement for a large contact area SD, but shows some deactivation improvement for a small contact area SD as the PMOS device has less deactivation than the NMOS device. 2E shows some deactivation improvement on the small area SD, and 2E also shows tighter distribution of $R_{CS}$ than 1C on both large and small contact areas at BEOL. Such features demonstrate that the ULE $BF_3$ PLAD process can improve deactivation of a PMOS device. $R_{CS}$ of a small contact area of a PMOS device is further improved (reduced) from ×0.37 at FEOL to ×0.32 at BEOL, though the improvement is not as large as for the NMOS device. PMOS device deactivation and deactivation improvement behaviors also imply and confirm that deactivation occurs at the interface of SD and spacer, and deactivation improvement mainly occurs at the edge region of the contact area; and strongly depends on perimeters of the contact area, not on bulk contact area.

Figure 17:
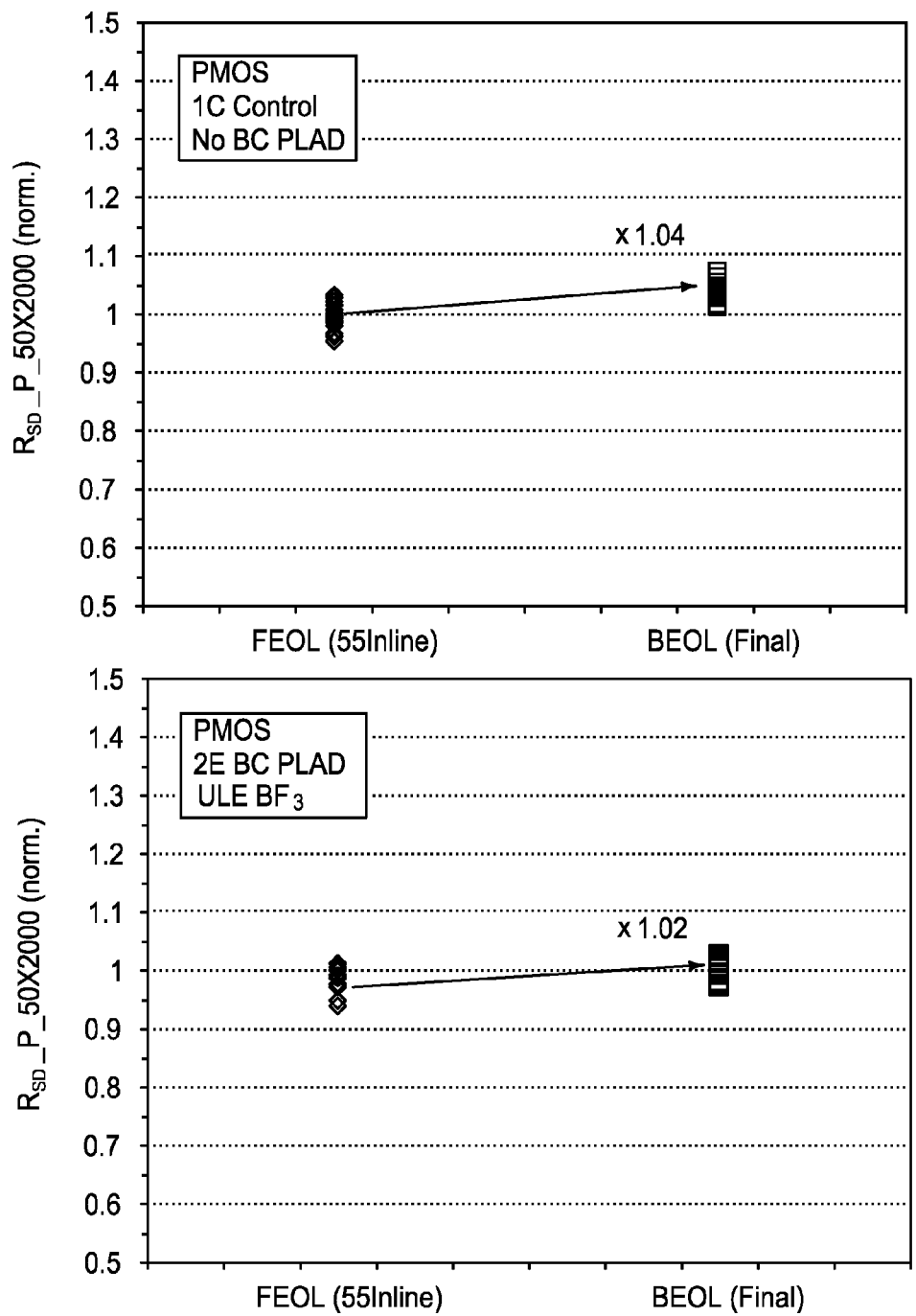

FIG. 17 compares series resistance $R_{SD}$ of a large area SD (W×L: about 50×2000) of the PMOS device between FEOL and BEOL, (top) 1C control group, and (bottom) 2E experimental group. $R_{SD}$ of 1C shows little deactivation from FEOL to BEOL by an increase of ×1.04. 2E shows similar (slightly less) deactivation than 1C with an increase of ×1.02.

Figure 18:
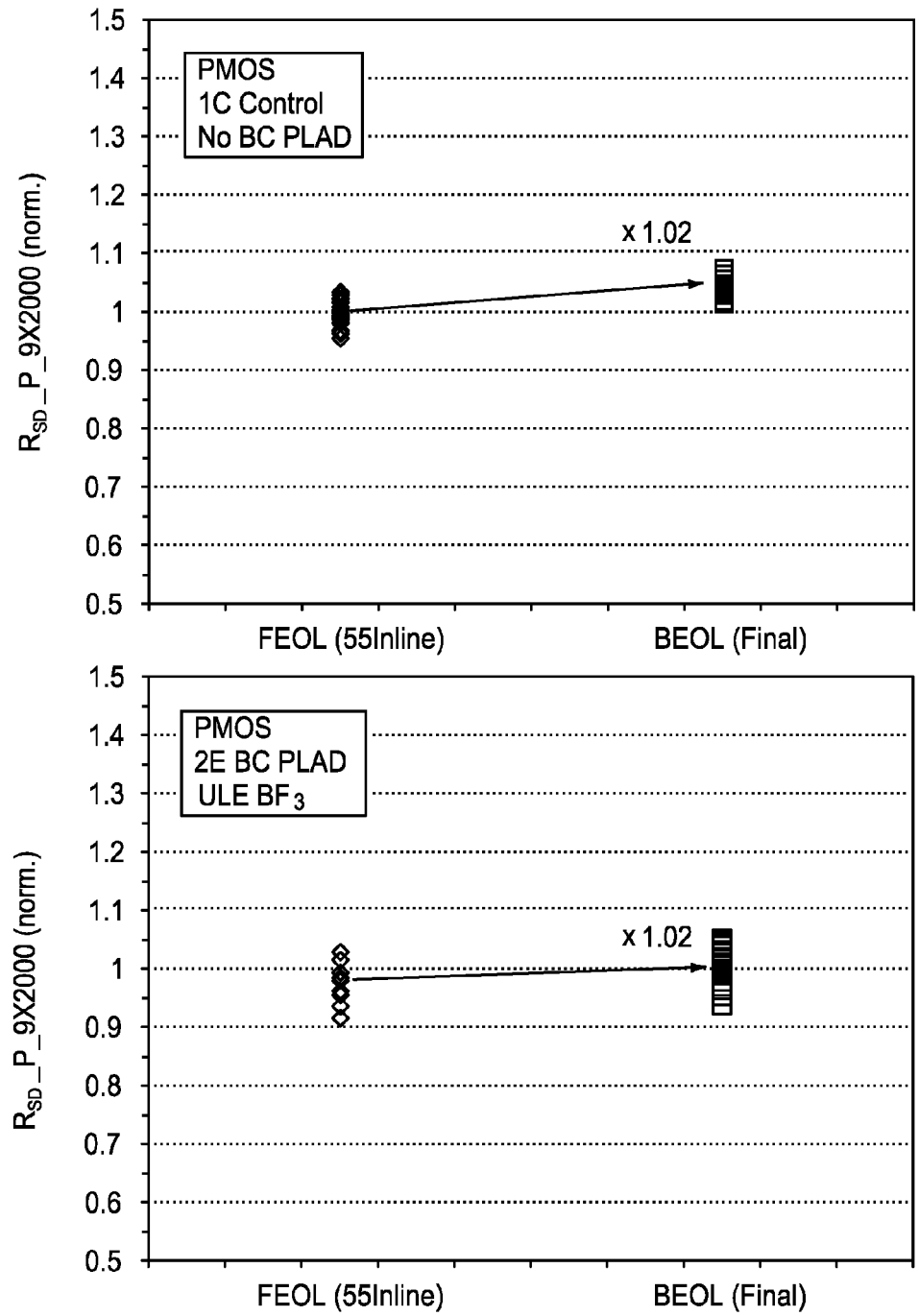

FIG. 18 compares series resistance $R_{SD}$ of a small area SD (W×L: about 9×2000) of the PMOS device between FEOL and BEOL, (top) 1C control group, and (bottom) 2E experimental group. $R_{SD}$ of 1C of the small area SD shows similar deactivation as the larger area SD from FEOL to BEOL by an increase of ×1.02. 2E also shows similar deactivation as 1C with an increase of ×1.02. As compared to $R_{CS}$ cases, $R_{SD}$ shows less deactivation and little deactivation improvement by 2E. Another interesting feature is that $R_{SD}$ deactivation and its improvement show little dependence on SD area. This feature implies and confirms that deactivation occurs at the interface of SD and spacer, and deactivation improvement mainly occurs at the edge of contact area; and strongly depends on perimeters of the contact area, not on bulk contact area.

Figure 19:
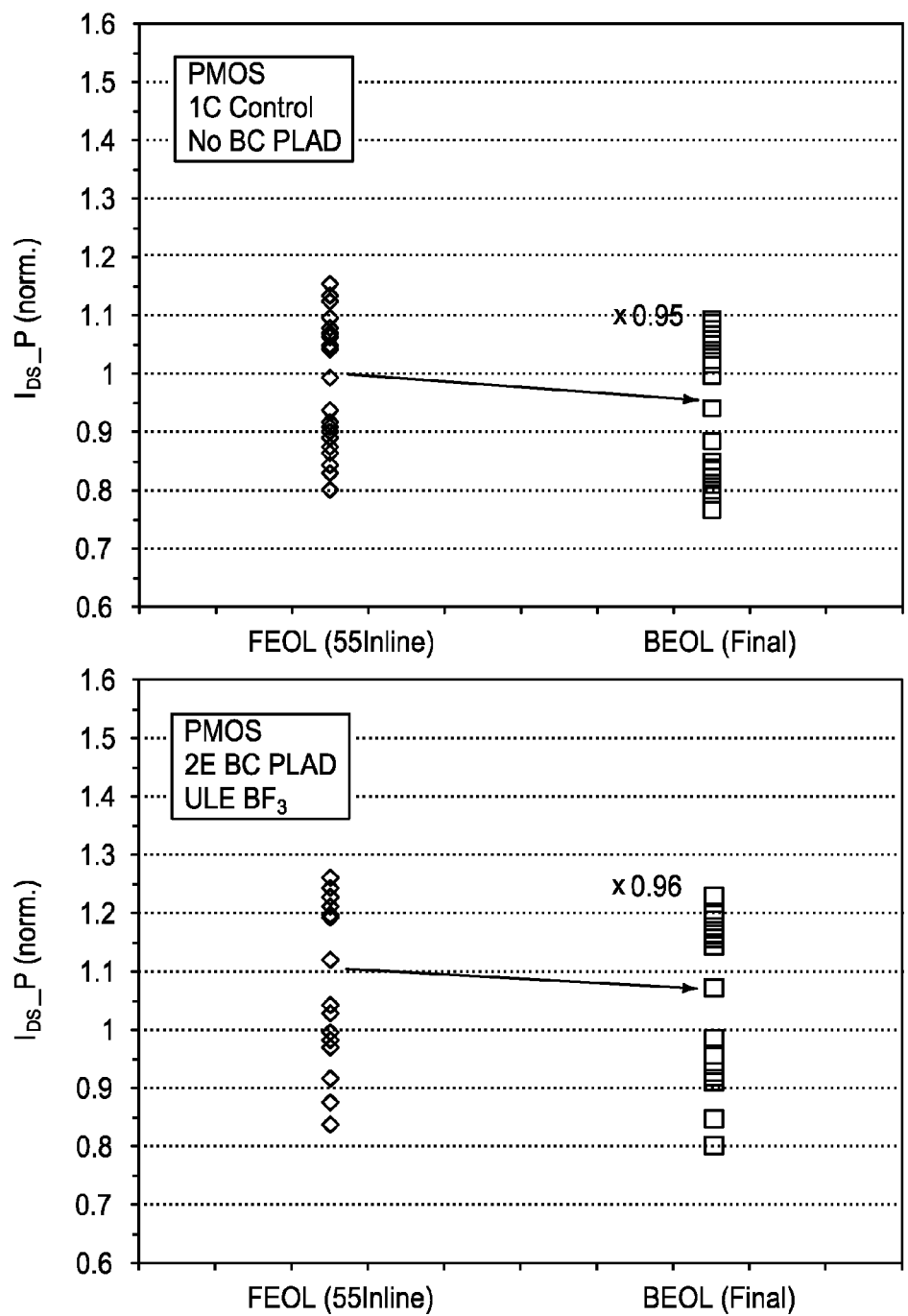

FIG. 19 compares drive current $I_{DS}$ of a standard (W×L: about 80×1) PMOS device between FEOL and BEOL, (top) 1C control group, and (bottom) 2E experimental group. $I_{DS}$ show less deactivation, which may be due to a combination of $R_{CS}$ and $R_{SD}$ increases caused by dopant loss and $L_{eff}$ reduction caused by more lateral diffusion. 2E shows similar deactivation as 1C (×0.96 versus ×0.95).

Figure 20:
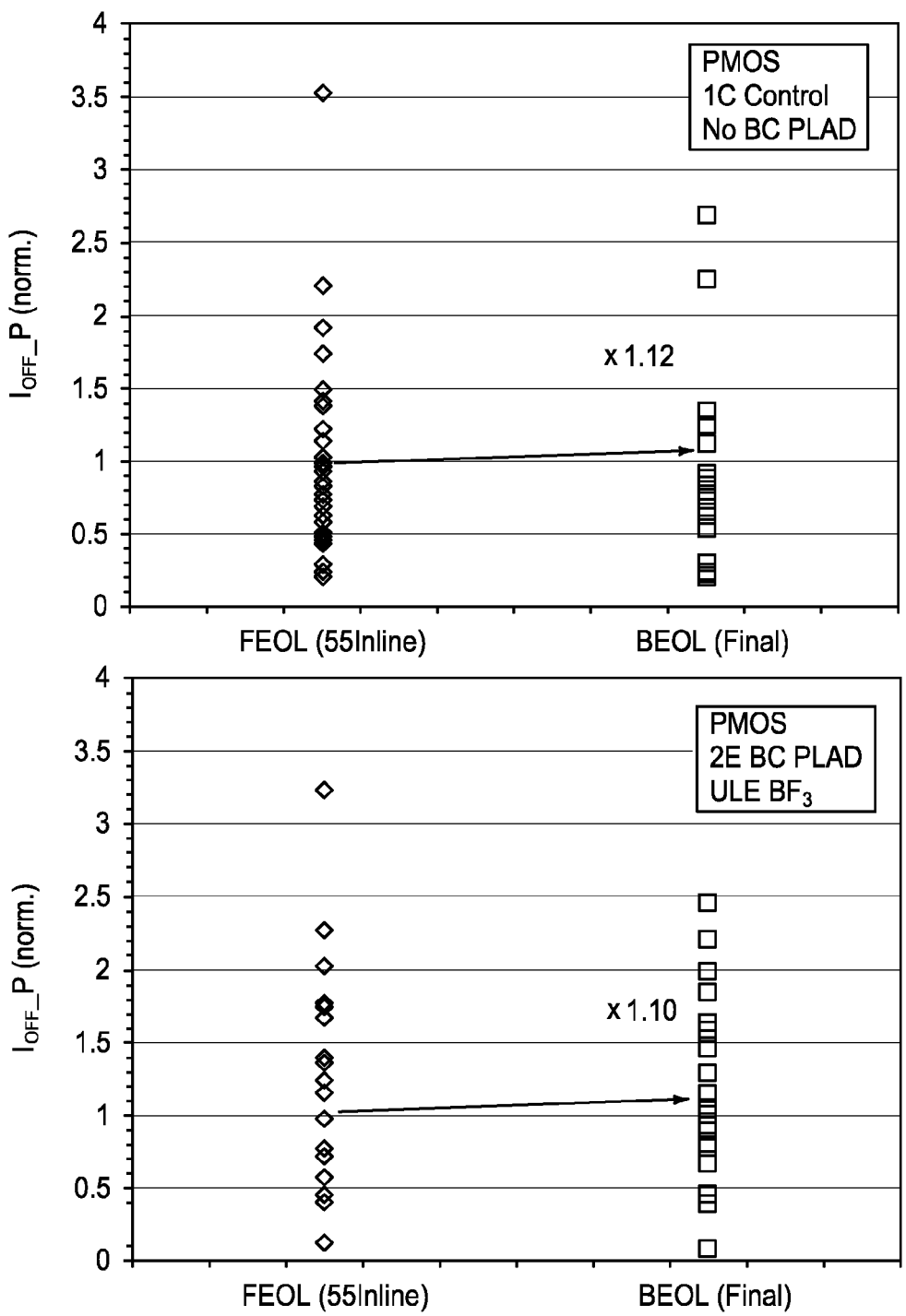

FIG. 20 compares $I_{OFF}$ of a standard (W×L: about 80×1) PMOS device between FEOL and BEOL, (top) 1C control group, and (bottom) 2E experimental group. $I_{OFF}$ shows degradation (increase), which may be due to a combination of $R_{CS}$ and $R_{SD}$ increases caused by dopant loss and $L_{eff}$ reduction caused by more lateral diffusion. As compared to the NMOS device, $L_{eff}$ reduction has more significant impact than dopant loss for the PMOS device because PMOS has less deactivation and boron dopant diffuses faster than arsenic dopant. This can be confirmed as $I_{OFF}$ of 1C shows ×1.12 increase but $I_{OFF}$ of 2E shows slightly less increase (×1.10) because 2E has less deactivation (dopant loss) than 1C.

Example 2

The standard CMOS circuit, including PMOS and NMOS devices, is fabricated as a self-aligned poly gate structure. The in-situ n-type doped poly-Si gate is deposited by a LPCVD process for the NMOS device, and counter-doped by $P^+$ (boron-based) plasma doping (PLAD) for the PMOS device. The raised source and drain (SD) regions are formed by a boron-based PLAD implant and a beam-line arsenic (As) implant for PMOS and NMOS devices, respectively. After the SD implants, the wafers are subjected to stripping, cleaning and rapid thermal-annealing processing (RTP) to activate the impurities. After the SD regions are formed, there are several process steps such as oxide and nitride depositions, contact area etching and cleaning, etc. Then the flood BC implant is conducted across the contact areas of the both PMOS and NMOS SD regions without masks. Metal contacts are formed by standard Ti/W-based metallization. Electrical characterization is performed after the final DRAM circuit processing is completed.

Table II shows six B-based (boron-based) flood BC implant splits used to compare with a POR 1C control group (the control group used no BC implant). The process conditions of flood BC implants are as follows: groups 2E to 4E use $B_2H_6$ PLAD with implant voltages of mild energy to ULE (for example, mild energy [i.e., low to mid energy] may be from about 1 kilovolt to a few kilovolts, and ULE may be less than 1 kV, such as, for example, about 0.5 kV), and a nominal dose of high to low regimes, respectively; groups 5E to 7E used $BF_3$ PLAD with the same voltage and dose regimes of group 2E to 4E.

TABLE II

MATRIX TABLE OF FLOOD BC IMPLANT EXPERIMENTS

| Group | Flood BC Implant Condition |
|---|---|
| 1C | POR Control (no BC Implant) |
| 2E | $B_2H_6$ Mid E/High dose |
| 3E | $B_2H_6$ Low E/High dose |
| 4E | $B_2H_6$ Ultra-Low E/Low dose |
| 5E | $BF_3$ Mid E/High dose |
| 6E | $BF_3$ Low E/High dose |
| 7E | $BF_3$ Ultra-Low E/Low dose |

PMOS Device Performance

Figure 21:
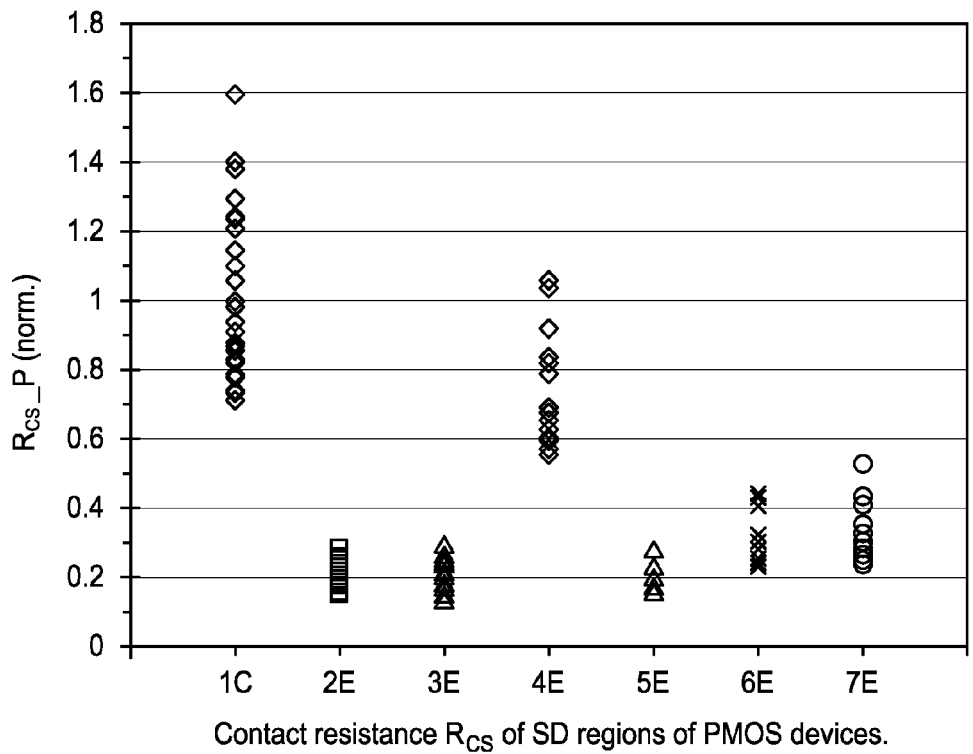

FIG. 21 compares normalized contact resistance $R_{CS}$ of the PMOS SD regions with metal conductive interconnects. The $R_{CS}$ of devices processed by BC implants are about 80 percent (about ×0.2) lower than those without a BC implant. Comparing with 1C, 2E reduced ×0.22, 5E reduced ×0.18, and 7E ($BF_3$ ULE) reduced ×0.32. Group 7E is interesting because this group also improved the NMOS device as discussed below. It is believed that the reduction in $R_{CS}$ is a result of the higher B concentration near the metal/Si interface and then lower Schottky Barrier Height (SBH). All experiment groups show a much tighter distribution than 1C.

Figure 22:
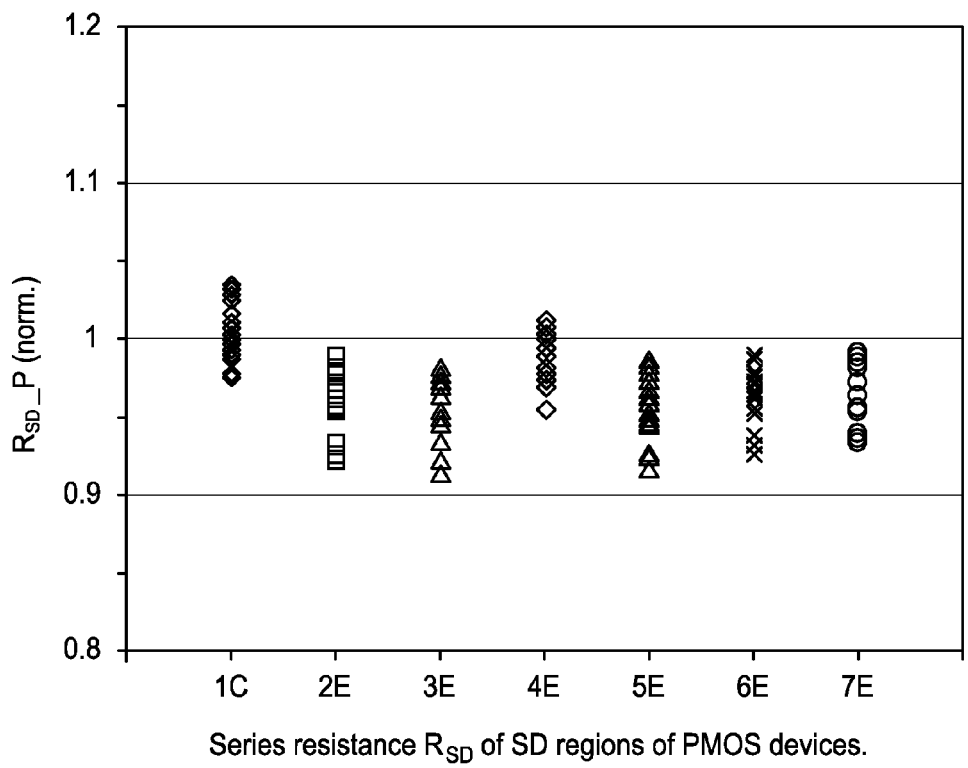

FIG. 22 shows series resistance $R_{SD}$ of SD regions of PMOS devices. Comparing with 1C, 2E reduced ×0.96, 5E reduced ×0.95, and 7E reduced ×0.96. The $R_{SD}$ of devices processed by BC implants are slightly lower than those without a BC implant because there is no high temperature thermal process (>700° C.) to activate boron at the back-end-of-line (BEOL) processing.

FIGS. 23 and 24 shows very similar threshold voltage $V_T$ and sub-threshold voltage $S_{VT}$ for the devices processed by BC implants as compared to those processed by POR. 5E has slightly higher $S_{VT}$, indicating higher $I_{OFF}$.

FIG. 25 shows $I_{DS}$ for the PMOS device. As compared to 1C, 2E increased ×1.18, 5E increased ×1.22, and 7E increased ×1.11.

FIG. 26 shows $I_{DS}$ versus $I_{OFF}$ and performance curves of standard PMOS devices. It is demonstrated that $I_{OFF}$ has no degradation, but the $I_{DS}$ of PMOS devices processed by BC implants show about 10 to 25 percent improvement as compared to 1C POR.

NMOS Device Performance

FIG. 27 compares $R_{CS}$ of the NMOS SD regions with metal conductive interconnects. For $B_2H_6$ PLAD and higher energy $BF_3$ PLAD groups, the $R_{CS}$ of devices processed by BC implants are significantly degraded relative to those without a BC implant because of a counter-doping effect, though BEOL has no high temperature thermal treatment to deactivate. However, low and ultra-low energy $BF_3$ PLAD splits show significant improvement. Comparing with 1C, 7E ($BF_3$ ULE) reduced ×0.51. The reduction in $R_{CS}$ may be a result of the Schottky Barrier Height (SBH) lowering effect (higher dopant concentration near the metal/Si interface), and deactivation improvement. The ULE $BF_3$ PLAD splits show a tighter distribution than 1C.

FIG. 28 shows series resistance $R_{SD}$ of SD regions of NMOS devices. For $B_2H_6$ PLAD splits, the $R_{SD}$ of devices processed by BC implants are significantly degraded relative to those without a BC implant because of a counter-doping effect. However, $BF_3$ PLAD splits show similar or slightly improved $R_{SD}$. Comparing with 1C, 7E reduced ×0.97.

FIG. 29 shows similar $V_T$ for the devices processed by BC implants as compared to those processed by POR, except for 2E which has more counter-doping effect.

FIG. 30 shows similar $S_{VT}$ for the devices processed by BC implants as compared to those processed by POR.

FIG. 31 shows drive current ($I_{DS}$) for the standard NMOS device. ULE $BF_3$ PLAD groups show some improvements. For $B_2H_6$ PLAD and higher energy $BF_3$ PLAD groups, the $I_{DS}$ of NMOS devices processed by BC implants are significantly degraded as compared to those without BC implant because of a counter-doping effect. However, ULE $BF_3$ PLAD groups show improvements. Comparing with 1C, 7E (BF3 ULE) improves $I_{DS}$ by ×1.04, (though it is not as good as the improvement of PMOS devices mentioned previously). The $I_{DS}$ improvement may be a result of the $R_{CS}$ reduction.

FIG. 32 shows $I_{DS}$ versus $I_{OFF}$ and performance curves of the standard NMOS devices. The $B_2H_6$ and higher energy $BF_3$ groups significantly degraded $I_{DS}$, but the $I_{DS}$ of NMOS devices processed by ULE $BF_3$ BC show about 4 percent increase as compared to 1C POR without $I_{OFF}$ degradation.

CONCLUSION

Some embodiments include a device comprising an n-type diffusion region and a boron-doped region within the n-type diffusion region. The boron-doped region extends no deeper than about 10 nanometers from an upper surface of the n-type diffusion region.

Some embodiments include a device comprising an n-type diffusion region and a dielectric structure over an upper surface of the n-type diffusion region. The dielectric structure comprises an opening to define a side surface of the dielectric structure and to expose a part of the upper surface of the n-type diffusion region. A boron-doped region is within the n-type diffusion region and reaches at least the part of the upper surface of the n-type diffusion region. An altered region extends from the side-surface of the dielectric structure to an inside of the dielectric structure. The altered region extends continuously to the boron-doped region. The boron-doped region and the altered region are substantially the same in boron concentration as each other.

Some embodiments include a device comprising n-type source/drain regions of an n-channel transistor, p-type source/drain regions of a p-channel transistor, a dielectric structure over upper surfaces of the n-type and the p-type source/drain regions, first boron-enhanced regions within the n-type source/drain regions, and second boron-enhanced regions within the p-type source/drain regions. Each of the first and the second boron-enhanced regions extends no deeper than about 10 nanometers from the upper surfaces of the n-type and p-type source/drain regions, respectively.

Some embodiments include a method which comprises introducing boron into an upper portion of an n-type diffusion region, with the upper portion being no deeper than about 10 nanometers from an upper surface of the n-type diffusion region.

Some embodiments include a method which comprises forming a gate over a channel region. N-type source/drain regions are formed to sandwich the channel region therebetween. Dielectric material is formed over the n-type source/drain regions. The dielectric material comprises openings that expose respective parts of upper surfaces of the n-type source/drain regions. PLAD (plasma doping) is utilized to dope boron at least into the n-type source/drain regions through the openings.

Some embodiments include a method which comprises simultaneously forming first boron-enhanced regions within upper portions of n-type source/drain regions of an NMOS (n-type metal-oxide-semiconductor) device and second boron-enhanced regions within upper portions of p-type source/drain regions of a PMOS (p-type metal-oxide-semiconductor) device. The first and second boron-enhanced regions extend to depths of less than or equal to about 10 nanometers.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:
1. A device, comprising:
an n-type region;
a dielectric structure over an upper surface of the n-type region, the dielectric structure comprising an opening to define a side surface of the dielectric structure and to expose a part of the upper surface of the n-type region, said part of the upper surface of the n-type region being beneath a bottom surface of the dielectric structure;
a first boron-containing region along an upper portion of the n-type region; and
a second boron-containing region extending from the side-surface of the dielectric structure to an inside of the dielectric structure, but not extending entirely through the dielectric structure; the second boron-containing region extending continuously to the first boron-containing region, wherein the first and second boron-containing regions are substantially the same in boron concentration as each other.

2. The device of claim 1 wherein the first boron-containing region extends no deeper than about 10 nanometers into a substrate comprising the n-type region; and wherein the second boron-containing region extends no deeper than about 10 nanometers from the side-surface of the dielectric structure.

3. The device of claim 1 further comprising a conductive contact within the opening and in contact with the first and second boron-containing regions; and wherein the conductive contact includes a metal silicide on the first boron-containing region.

4. The device of claim 1 wherein boron is present in each of the first and second boron-containing regions to a concentration within a range of from about 1 atomic percent to about 10 atomic percent.

5. A device, comprising:
n-type source/drain regions of an n-channel transistor;
p-type source/drain regions of a p-channel transistor;
a dielectric structure over upper surfaces of the n-type and the p-type source/drain regions;
first boron-enhanced regions within the n-type source/drain regions;
second boron-enhanced regions within the p-type source/drain regions;
wherein each of the first and the second boron-enhanced regions extends no deeper than about 10 nanometers from the upper surfaces of the n-type and p-type source/drain regions, respectively; and
wherein the dielectric structure comprises first, second, third and fourth openings that expose respective parts of the upper surfaces of the n-type and p-type source/drain regions, and the dielectric structure further comprises altered regions therein, the altered regions extending to an inside of the dielectric structure no deeper than about 10 nanometers from the first, second, third and fourth openings.

6. The device of claim 5 further comprising conductive contacts within the first, second, third and fourth openings and in contact with the first and second boron-enhanced regions and the altered regions; and wherein the conductive contacts includes metal silicide on the first and second boron-enhanced regions.

7. The device of claim 5 wherein boron is present in the first and second boron-doped regions, and in the altered regions, to a concentration within a range of from about 1 atomic percent to about 10 atomic percent.

8. A device, comprising:
n-type source/drain regions of an n-channel transistor; the n-type source/drain regions extending into a silicon-containing substrate;
p-type source/drain regions of a p-channel transistor; the p-type source/drain regions extending into the silicon-containing substrate;
a dielectric structure over upper surfaces of the n-type and the p-type source/drain regions;
first boron-enhanced regions within the n-type source/drain regions;
second boron-enhanced regions within the p-type source/drain regions;
wherein each of the first and the second boron-enhanced regions extends no deeper than about 10 nanometers from the upper surfaces of the n-type and p-type source/drain regions, respectively; and
wherein the dielectric structure comprises first, second, third and fourth openings that expose respective parts of the upper surfaces of the n-type and p-type source/drain regions, and the dielectric structure further comprises boron-containing regions therein, the boron-containing regions extending to an inside of the dielectric structure no deeper than about 10 nanometers from the first, second, third and fourth openings.

* * * * *